(12) United States Patent
Tanaka et al.

(10) Patent No.: US 10,937,874 B2
(45) Date of Patent: Mar. 2, 2021

(54) SEMICONDUCTOR DEVICE

(71) Applicant: NISSAN MOTOR CO., LTD., Yokohama (JP)

(72) Inventors: Ryota Tanaka, Kanagawa (JP); Tetsuya Hayashi, Kanagawa (JP); Wei Ni, Kanagawa (JP); Yasuaki Hayami, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 250 days.

(21) Appl. No.: 16/323,373

(22) PCT Filed: Aug. 10, 2016

(86) PCT No.: PCT/JP2016/073525
§ 371 (c)(1),
(2) Date: Feb. 5, 2019

(87) PCT Pub. No.: WO2018/029796
PCT Pub. Date: Feb. 15, 2018

(65) Prior Publication Data
US 2020/0381522 A1     Dec. 3, 2020

(51) Int. Cl.
*H01L 29/41*     (2006.01)
*H01L 29/417*    (2006.01)
(Continued)

(52) U.S. Cl.
CPC .... *H01L 29/41725* (2013.01); *H01L 29/4236* (2013.01); *H01L 29/7813* (2013.01); *H01L 29/7825* (2013.01)

(58) Field of Classification Search
CPC ............ H01L 29/7397; H01L 29/7813; H01L 29/7827; H01L 27/2454; H01L 21/823487; H01L 21/823885; H01L 29/0843–0891; H01L 29/66636–66643; H01L 27/0705; H01L 27/0925–0928; H01L 21/823418–823425; H01L 29/823807–823814; H01L 29/41725; H01L 29/42356–42364; H01L 29/7825; (Continued)

(56) References Cited

U.S. PATENT DOCUMENTS 5,682,048 A * 10/1997 Shinohara ........... H01L 29/0696
257/331
5,869,875 A    2/1999 Hebert
(Continued)

FOREIGN PATENT DOCUMENTS

JP    2-271637 A     11/1990
JP    2002-504267 A   2/2002
(Continued)

*Primary Examiner* — Maliheh Malek
(74) *Attorney, Agent, or Firm* — Foley & Lardner LLP

(57) ABSTRACT

A semiconductor device includes: a gate electrode groove formed in contact with a drift region, a well region, and a source region; a gate electrode formed on a surface of the gate electrode groove via an insulating film; a source electrode groove in contact with the gate electrode groove; a source electrode electrically connected to a source region; and a gate wiring electrically insulated from the source electrode and formed inside the source electrode groove in contact with the gate electrode.

8 Claims, 20 Drawing Sheets

US 10,937,874 B2
Page 2

(51) Int. Cl.
  *H01L 29/78* (2006.01)
  *H01L 29/423* (2006.01)
  *H01L 21/8232* (2006.01)
  *H01L 27/088* (2006.01)

(58) Field of Classification Search
  CPC .............. H01L 21/048; H01L 21/743; H01L 21/823437; H01L 21/823493; H01L 29/41766; H01L 29/41775
  See application file for complete search history.

(56) References Cited

U.S. PATENT DOCUMENTS

| | | | | |
|---|---|---|---|---|
| 5,998,833 A * | 12/1999 | Baliga | ............ | H01L 29/407 257/329 |
| 6,388,286 B1 * | 5/2002 | Baliga | ............ | H01L 27/095 257/330 |
| 7,553,722 B2 * | 6/2009 | Sakakibara | ......... | H01L 27/0255 438/246 |
| 8,786,011 B2 * | 7/2014 | Yamagami | .......... | H01L 29/1095 257/328 |
| 9,252,261 B2 * | 2/2016 | Yamagami | .......... | H01L 29/7801 |
| 9,530,882 B1 * | 12/2016 | Hsieh | ............ | H01L 29/7811 |
| 9,673,318 B1 * | 6/2017 | Mirchandani | ........ | H01L 29/407 |
| 9,799,743 B1 * | 10/2017 | Li | .............. | H01L 29/8725 |
| 2006/0017056 A1 * | 1/2006 | Hirler | ............ | H01L 29/7813 257/77 |
| 2006/0076614 A1 * | 4/2006 | Ninomiya | ........... | H01L 29/7813 257/330 |
| 2007/0145479 A1 * | 6/2007 | Yamauchi | .......... | H01L 29/7813 257/344 |
| 2008/0197361 A1 * | 8/2008 | Ueno | .............. | H01L 29/7722 257/77 |
| 2009/0078995 A1 * | 3/2009 | Nakagawa | .......... | H01L 29/7813 257/330 |
| 2009/0140327 A1 * | 6/2009 | Hirao | ............. | H01L 29/66727 257/328 |
| 2010/0001314 A1 * | 1/2010 | Yanagigawa | ....... | H01L 29/7397 257/124 |
| 2010/0163988 A1 * | 7/2010 | Chow | ............. | H01L 29/66704 257/342 |
| 2010/0193799 A1 * | 8/2010 | Nakano | ............. | H01L 29/4236 257/77 |
| 2011/0169103 A1 * | 7/2011 | Darwish | ............ | H01L 29/7835 257/409 |
| 2011/0233659 A1 * | 9/2011 | Tai | ............... | H01L 29/66734 257/330 |
| 2012/0061747 A1 * | 3/2012 | Uchihara | ........ | H01L 21/823487 257/329 |
| 2012/0217575 A1 * | 8/2012 | Matsuda | ........... | H01L 21/26586 257/330 |
| 2012/0241848 A1 * | 9/2012 | Uchihara | ............ | H01L 29/7808 257/330 |
| 2013/0062690 A1 * | 3/2013 | Yoshimochi | ...... | H01L 29/66727 257/334 |
| 2013/0313635 A1 * | 11/2013 | Nakano | ............. | H01L 29/66727 257/330 |
| 2013/0334597 A1 * | 12/2013 | Yamashita | ........ | H01L 29/42376 257/334 |
| 2014/0175459 A1 * | 6/2014 | Yamamoto | ........ | H01L 29/66068 257/77 |
| 2014/0197479 A1 * | 7/2014 | Um | ...................... | H01L 29/7803 257/330 |
| 2014/0339602 A1 | 11/2014 | Higuchi et al. | | |
| 2015/0115286 A1 * | 4/2015 | Takeuchi | ............ | H01L 21/8213 257/77 |
| 2015/0179791 A1 * | 6/2015 | Kudou | ............. | H01L 29/66068 257/77 |
| 2015/0214355 A1 * | 7/2015 | Nakano | ............... | H01L 29/7805 257/330 |
| 2016/0141371 A1 * | 5/2016 | Tega | ................. | H01L 21/02378 257/77 |
| 2016/0141403 A1 * | 5/2016 | Riegler | ............. | H01L 29/4238 257/139 |
| 2016/0181371 A1 * | 6/2016 | Ni | ....................... | H01L 27/1203 257/77 |
| 2016/0260824 A1 * | 9/2016 | Udrea | ................. | H01L 29/7397 |
| 2016/0351702 A1 * | 12/2016 | Numabe | ............ | H01L 29/41741 |
| 2016/0380096 A1 * | 12/2016 | Izumi | ................. | H01L 29/7813 257/333 |
| 2017/0236931 A1 * | 8/2017 | Meiser | ................ | H01L 29/1095 257/334 |
| 2017/0301788 A1 * | 10/2017 | Fukui | ................. | H01L 29/0661 |
| 2018/0006026 A1 * | 1/2018 | Lui | ................. | H01L 21/823487 |
| 2018/0114857 A1 * | 4/2018 | Okada | ................ | H01L 27/0255 |
| 2018/0151366 A1 * | 5/2018 | Endo | ................. | H01L 29/1095 |
| 2019/0019680 A1 * | 1/2019 | Takeuchi | ............ | H01L 21/0262 |
| 2019/0341486 A1 * | 11/2019 | Ni | ....................... | H01L 29/0878 |
| 2020/0075763 A1 * | 3/2020 | Shi | .................... | H01L 29/4236 |

FOREIGN PATENT DOCUMENTS

| | | |
|---|---|---|
| JP | 2011-171420 A | 9/2011 |
| JP | 2013-183071 A | 9/2013 |
| WO | WO 2014/054375 A1 | 4/2014 |
| WO | WO 2015/008550 A1 | 1/2015 |

* cited by examiner

SEMICONDUCTOR DEVICE

TECHNICAL FIELD

The present invention relates to a semiconductor device.

BACKGROUND ART

Patent Literature 1 discloses a semiconductor device in which a base layer forming a channel, an emitter layer, and a collector layer are formed in a surface layer portion of a drift layer. This semiconductor device has an insulating film on the back surface of the drift layer, and gate electrodes formed in trenches reach the insulating film, thus achieving reduction in the electric field concentration at end portions of the trenches to improve withstand voltage performance.

CITATION LIST

Patent Literature

Patent Literature 1: Japanese Patent Application Publication No. 2013-183071

SUMMARY OF INVENTION

Technical Problem

However, in the semiconductor device described in Patent Literature 1, gate wiring connected to the gate electrodes is formed on the front surface side of the drift layer and is thus located near the base layer forming the channel; consequently, the potential of the gate wiring may influence the channel, fluctuating threshold voltage.

In view of the above problem, the present invention aims to provide a semiconductor device capable of reducing threshold voltage fluctuation.

Solution to Problem

A semiconductor device according to an aspect of the present invention includes: a gate electrode groove formed in contact with a drift region, a well region, and a source region; a gate electrode formed on a surface of the gate electrode groove via an insulating film; a source electrode groove in contact with the gate electrode groove; a source electrode electrically connected to a source region; and a gate wiring electrically insulated from the source electrode and formed inside the source electrode groove in contact with the gate electrode.

Advantageous Effects of Invention

An aspect of the present invention can provide a semiconductor device capable of reducing threshold voltage fluctuation.

DESCRIPTION OF EMBODIMENTS

First to fourth embodiments of the present invention are described below with reference to the drawings. Throughout the drawings, the same or similar reference signs_denote the same or similar portions, and overlapping descriptions are omitted. It should be noted that the drawings are schematic and dimensional relations and ratios may be different from actual ones. Moreover, the drawings also include portions having different dimensional relations and ratios from each other. Further, the following embodiments are provided to exemplify devices and methods to embody the technical concept of the present invention, and the technical concept of the present invention is not limited to the materials, shapes, structures, arrangements, and the like of constituents given below.

It should also be noted that the "first conductivity type" and the "second conductivity type" as referred to in the following embodiments are opposite conductivity types from each other. Specifically, when the first conductivity type is an n type, the second conductivity type is a p type, and when the first conductivity type is a p type, the second conductivity type is an n type. Although the following description takes a case where the first conductivity type is an n type and the second conductivity type is a p type, the first conductivity may be a p type and the second conductivity type may be an n type, instead. If the n type and the p type are interchanged, the polarities of applied voltage are reversed as well.

First Embodiment

Figure 1:
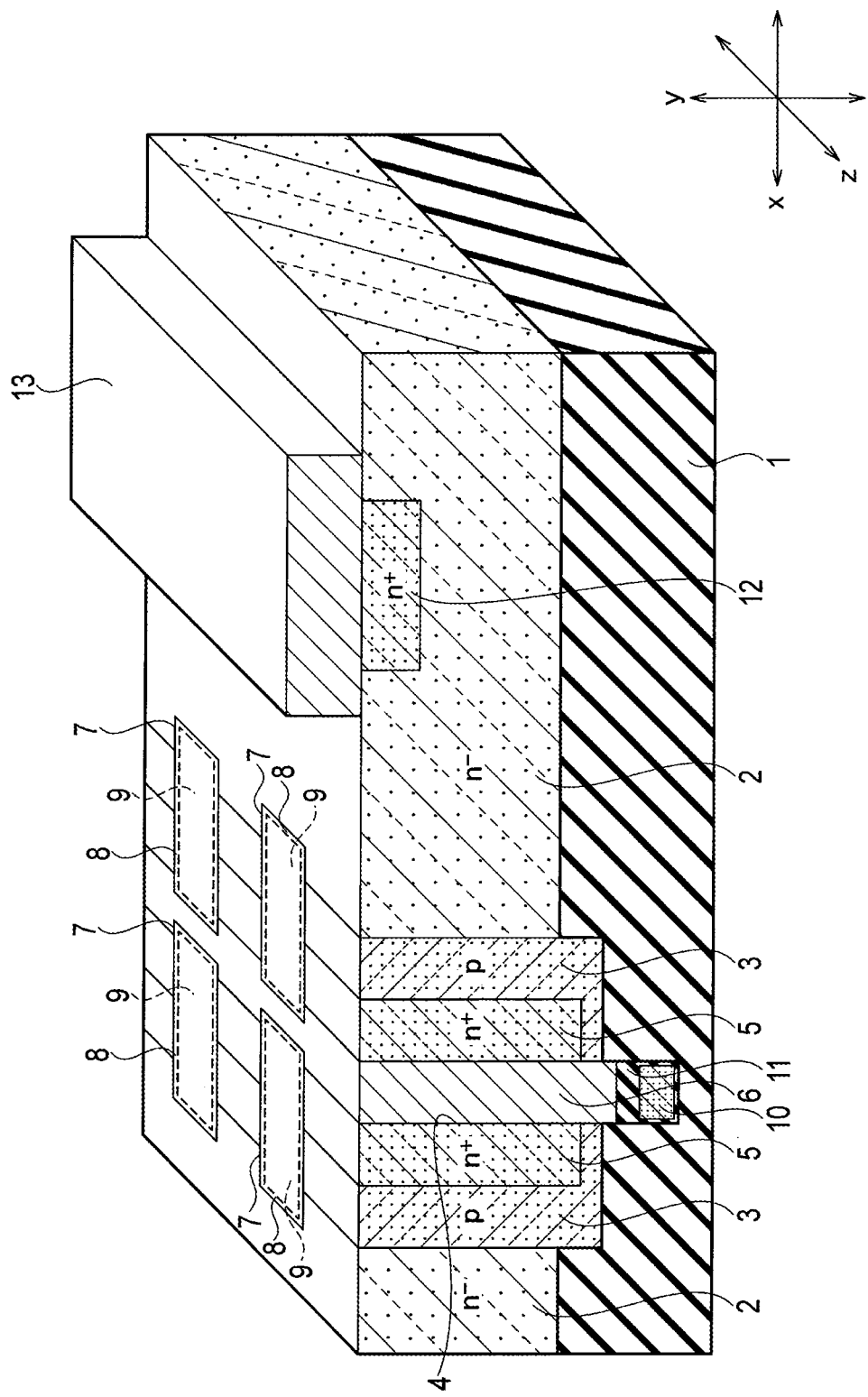
FIG. 1 is a perspective view illustrating a semiconductor device according to a first embodiment of the present invention.

FIG. 1 is a perspective view schematically illustrating the configuration of a semiconductor device according to a first embodiment of the present invention. The first embodiment exemplifies a semiconductor device having metal-oxide-semiconductor field-effect transistors (MOSFET) as a plurality of semiconductor elements. The semiconductor elements are further arranged in many arrays in two axis directions (the X-axis direction and the Z-axis direction) on a plane. Note that FIG. 1 omits illustration of part of electrodes and wiring to facilitate understanding.

The semiconductor device according to the first embodiment includes, as illustrated in FIG. 1, a substrate 1, a drift region 2, a well region 3, a source electrode groove 4, a source region 5, a source electrode 6, a gate electrode groove 7, a gate insulating film 8, a gate electrode 9, gate wiring 10, a silicon oxide film 11, a drain region 12, and a drain electrode 13.

The substrate 1 is, for example, a flat plate made of a semi-insulator or an insulator. Herein, an insulator means a material with a sheet resistance of several k Ω/sq or above, and a semi-insulator means a material with a sheet resistance of several tens of Wsq or above. For example, polytype-4H silicon carbide (SiC) may be used as an insulator material for the substrate 1. The substrate 1 has a thickness of, for example, approximately several tens of μm to several hundreds of μm in order to ensure mechanical strength of the semiconductor device.

The drift region 2 is an n⁻-type region formed on one side of the substrate 1 (hereinafter referred to as a "first main surface"). The impurity concentration of the drift region 2 is higher than that of the substrate 1, and is, for example, approximately $1\times10^{14}$ cm$^{-3}$ to $1\times10^{18}$ cm$^{-3}$. The drift region 2 may be formed of the same material as the substrate 1. For example, if the substrate 1 is made of polytype-4H SiC, the drift region 2 is an epitaxially-grown layer made of polytype-4H SiC. The drift region 2 has a thickness of, for example, approximately a few μm to several tens of μm.

The source electrode groove 4 is a groove formed from a main surface of the drift region 2 (hereinafter referred to as a "second main surface") which is opposite from a main surface of the drift region 2 in contact with the substrate 1 (hereinafter referred to as a "first main surface") into the substrate 1 in a direction perpendicular to the second main surface of the drift region 2 (y-axis direction). In other words, the depth of the source electrode groove 4 is larger than the thickness of the drift region 2. The dimension of the source electrode groove 4 is determined by design conditions such as the degree of integration of the semiconductor device and the process accuracies. The source electrode groove 4 is, for example, 2 μm wide. The source electrode groove 4 extends in one direction (z-axis direction) parallel to the second main surface of the drift region 2.

The well region 3 is a p-type region which is in contact with the side surface of the source electrode groove 4 and is formed inside the drift region 2 at least partially. The well region 3 is formed from the second main surface of the drift region 2 into the substrate 1 in a direction perpendicular to the second main surface of the drift region 2 (y-axis direction). The depth of the well region 3 is smaller than the depth of the source electrode groove 4. The well region 3 extends in a direction in which the source electrode groove 4 extends (z-axis direction). The impurity concentration of the well region 3 is, for example, approximately $1\times10^{15}$ cm$^{-3}$ to $1\times10^{19}$ cm$^{3}$.

The source region 5 is an n⁺-type region which is in contact with the side surface of the source electrode groove 4 and is formed inside the well region 3. The source region 5 is formed from the second main surface of the drift region 2 into the substrate 1 in a direction perpendicular to the second main surface of the drift region 2 (y-axis direction). The depth of the source region 5 is smaller than the depth of the well region 3. The source region 5 extends in a direction in which the source electrode groove 4 extends (z-axis direction). The impurity concentration of the source region 5 is higher than that of the drift region 2, and is, for example, approximately $1\times10^{18}$ cm$^{-3}$ to $1\times10^{21}$ cm$^{3}$.

The source electrode 6 is electrically connected to the source region 5. The source electrode 6 is formed inside the source electrode groove 4 and thereby forms ohmic connection to the source region 5. The source region 5 and the well region 3 have the same potential as the source electrode 6. Examples of a material usable for the source electrode 6 include conductors containing a metal material such as nickel silicide (NiSi), titanium (Ti), or molybdenum (Mo). The source electrode 6 may have a multilayer structure including a layer of a metal material forming ohmic connection to the source region 5 and a layer of a metal material such as aluminum (Al), copper (Cu), gold (Au), nickel (Ni), or silver (Ag).

The gate electrode groove 7 is a groove formed from the second main surface of the drift region 2 into the substrate 1 in a direction perpendicular to the second main surface of the drift region 2 (y-axis direction). The gate electrode groove 7 extends in a direction (x-axis direction) parallel to the second main surface of the drift region 2 and orthogonal to the direction in which the source electrode groove 4 extends, and is in contact with the source electrode groove 4, the drift region 2, the well region 3, and the source region 5. The gate electrode groove 7 penetrates the well region 3 and the source region 5. The depth of the gate electrode groove 7 is equal to the depth of the source electrode groove 4. Multiple lines of the gate electrode groove 7 are arranged in a direction (z-axis direction) parallel to the second main surface of the drift region 2 and orthogonal to the direction in which each gate electrode groove 7 extends.

The gate insulating film 8 is formed on the surface of the gate electrode groove 7. A material for the gate insulating film 8 is, for example, an insulator such as silicon oxide ($SiO_2$). The gate electrode 9 is formed on the surface of the gate insulating film 8. In other words, the gate electrode 9 is formed to be in contact with the surface of the gate electrode groove 7 with the gate insulating film 8 interposed therebetween. A material for the gate electrode 9 is, for example, polycrystalline silicon. The gate electrode 9 is arranged inside each gate electrode groove 7 with its surface covered by the gate insulating film 8. The gate electrode 9 is covered by the gate insulating film 8 also at the opening portion of the gate electrode groove 7 at the second main surface of the drift region 2.

The gate wiring 10 is electrically insulated from the source electrode 6, and is formed inside the source electrode 6 while being in contact with the gate electrode 9. The gate wiring 10 is located in a lower portion of the source electrode groove 4 with the silicon oxide film 11, which is an insulating film, being formed on the surface of the gate wiring 10. The silicon oxide film 11 insulates the gate wiring 10 and the source electrode 6 from each other. The space inside the source electrode groove 4 except for the gate wiring 10 and the silicon oxide film 11 is filled with the source electrode 6. The silicon oxide film 11 is not formed at an area of the surface of the gate wiring 10 that is in contact with the gate electrode 9. Similarly, the gate insulating film 8 is not formed at an area of the surface of the gate electrode 9 that is in contact with the gate wiring 10.

The drain region 12 is an n$^+$-type region formed inside the drift region 2 away from the well region 3. The drain region 12 is formed from the second main surface of the drift region 2 in a direction perpendicular to the second main surface of the drift region 2 (y-axis direction). The depth of the drain region 12 is smaller than the thickness of the drift region 2. The drain region 12 extends in a direction in which the source electrode groove 4 extends (z-axis direction). The drain region 12 has the same conductivity type as the drift region 2. The impurity concentration of the drain region 12 is higher than that of the drift region 2 and is approximately equal to that of the source region 5, and is, for example, approximately $1\times10^{18}$ cm$^{-3}$ to $1\times10^{21}$ cm$^{-3}$.

The drain electrode 13 is electrically connected to the drain region 12. The drain electrode 13 is formed on the second main surface of the drift region 2 and is in contact with the drain region 12 exposed at the second main surface. The drain electrode 13 may be formed of, for example, the same material as the source electrode 6.

Figure 2:
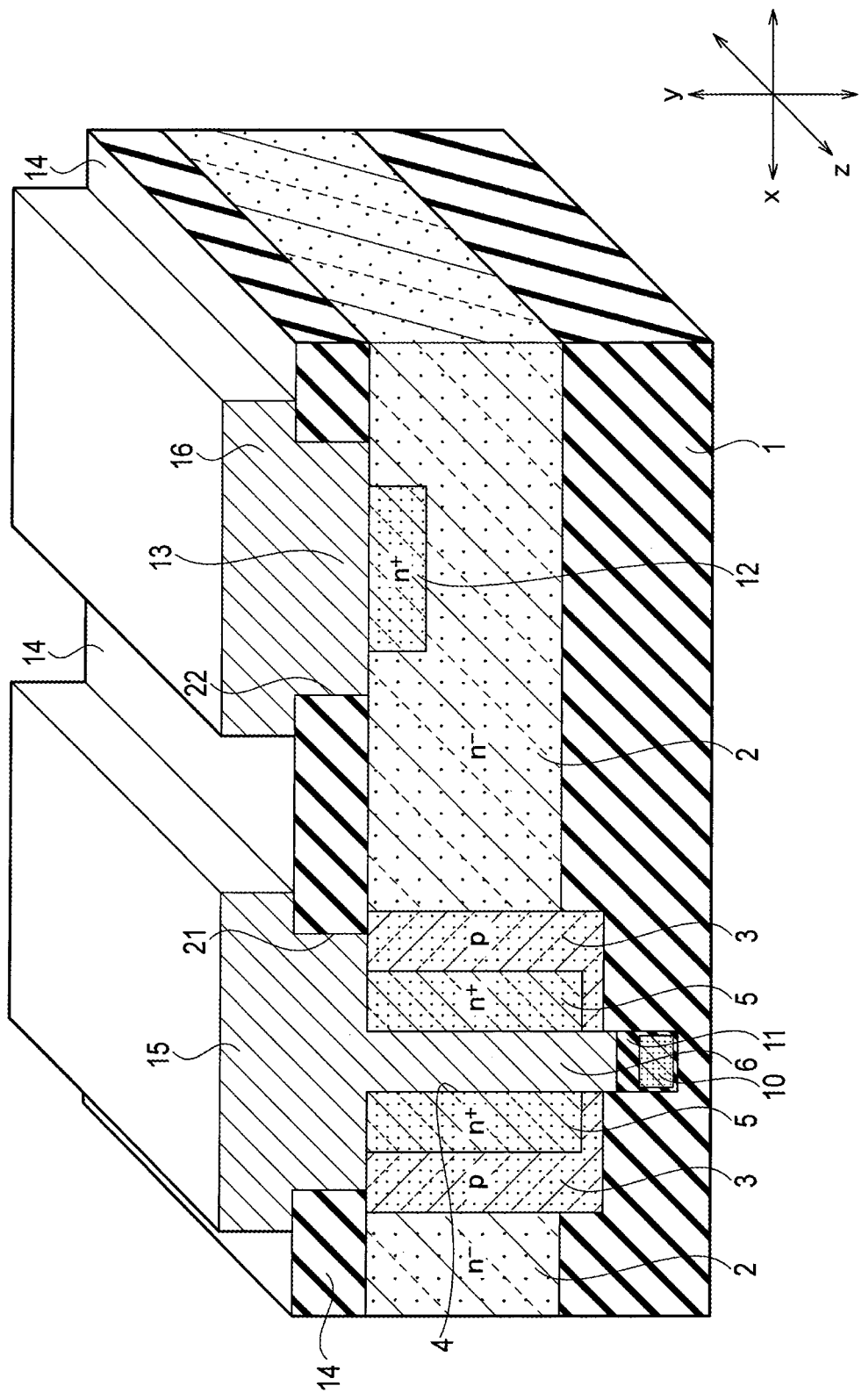
FIG. 2 is a perspective view illustrating the semiconductor device according to the first embodiment of the present invention.

FIG. 2 is a diagram illustrating part of the configuration of the semiconductor device according to the first embodiment that is omitted in FIG. 1. As illustrated in FIG. 2, the semiconductor device according to the first embodiment further includes an interlayer insulating film 14, source wiring 15, and drain wiring 16.

The interlayer insulating film 14 is formed on the second main surface of the drift region 2. The interlayer insulating film 14 is made of an insulator containing a ceramic material such as silicon oxide (SiO$_2$) or silicon nitride (Si$_3$N$_4$). The interlayer insulating film 14 has a groove 21 and a groove 22 each penetrating the interlayer insulating film 14 from one surface thereof to the other. The groove 21 extends above the source electrode groove 4 in the direction in which the source electrode groove 4 extends. An upper part of the source electrode 6, which is not depicted in FIG. 1, is inserted into the groove 21. The source electrode 6 is in contact with the source region 5 and the well region 3 at the second main surface of the drift region 2 and is formed away from the drift region 2. The groove 22 extends above the drain region 12 in the direction in which the drain region 12 extends. The drain electrode 13 is inserted into the groove 22.

The source wiring 15 is formed on the upper surface of the interlayer insulating film 14, covering the source electrode 6 exposed at the groove 21. The upper surface of the interlayer insulating film 14 is a main surface opposite from and parallel to the second main surface of the drift region 2. The source wiring 15 extends in the direction in which the groove 21 extends. The drain wiring 16 is formed on the upper surface of the interlayer insulating film 14, covering the drain electrode 13 exposed at the groove 22. The drain wiring 16 extends in the direction in which the groove 22 extends. The source wiring 15 and the drain wiring 16 are formed away from and parallel to each other.

Figure 3:
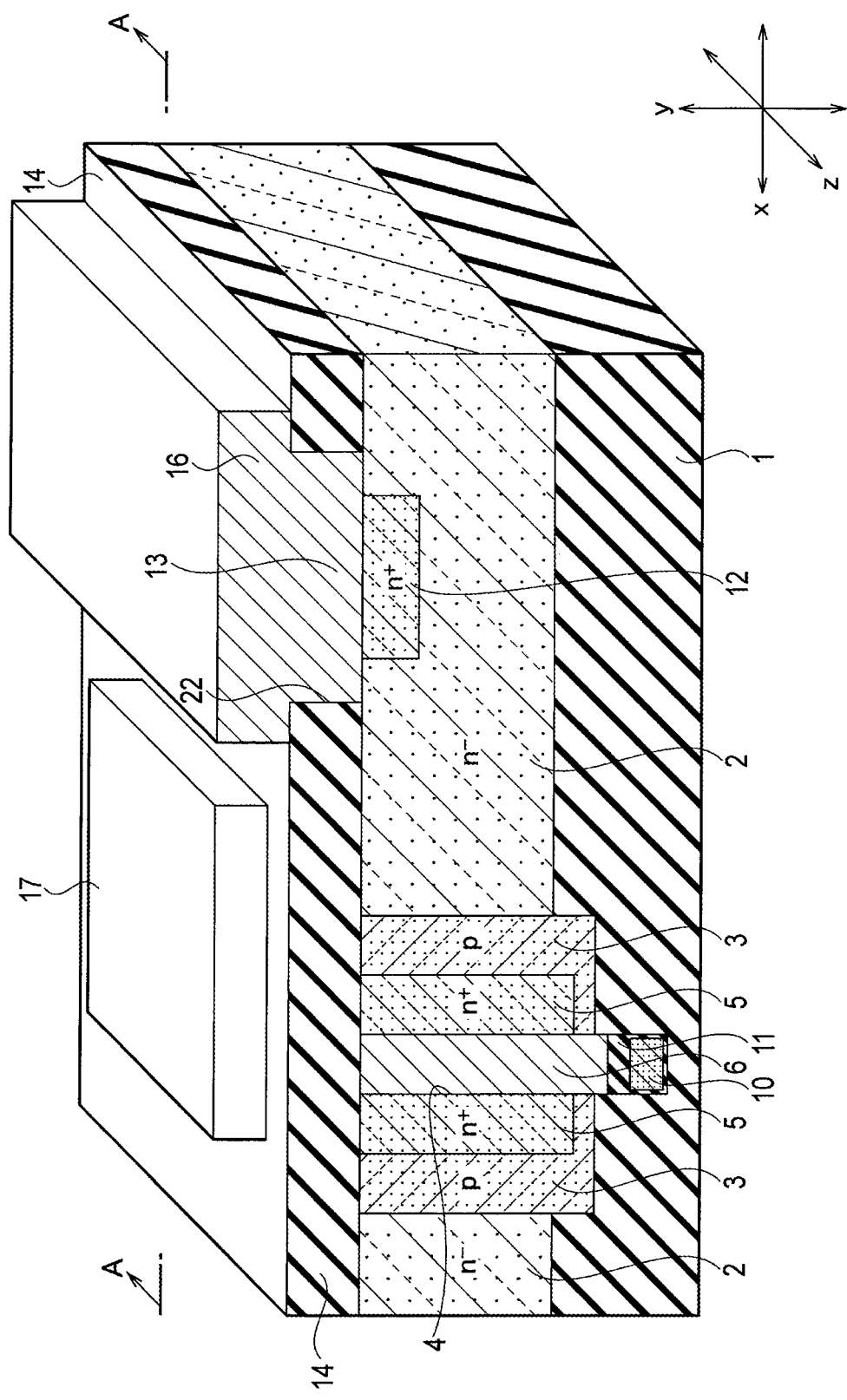
FIG. 3 is a perspective view illustrating the semiconductor device according to the first embodiment of the present invention.
Figure 4:
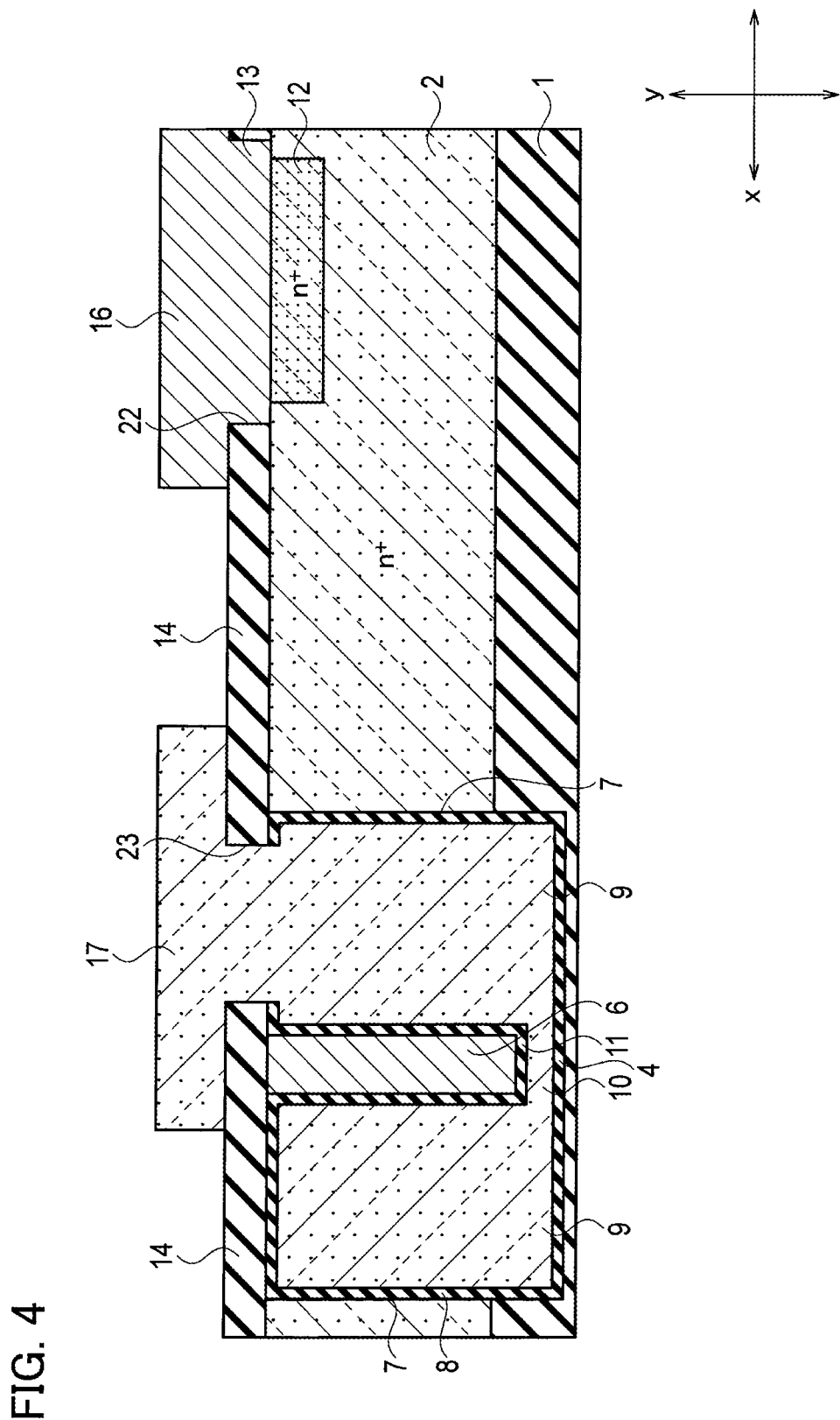
FIG. 4 is a sectional view seen in the direction A-A in FIG. 3.

FIG. 3 is a diagram illustrating an example configuration of connection to the potentials of the gate electrode 9 and the gate wiring 10 in the semiconductor device according to the first embodiment. FIG. 4 is a sectional view seen in the direction A-A in FIG. 3. FIGS. 3 and 4 selectively illustrate an area of the semiconductor device according to the first embodiment different from the area illustrated in FIGS. 1 and 2 in the z-axis direction.

The semiconductor device of the first embodiment further includes a gate pad 17 formed on part of the interlayer insulating film 14. As illustrated in FIG. 4, the interlayer insulating film 14 has a through-hole 23 formed above at least one of the gate electrodes 9. The gate insulating film 8 formed on the upper surface of the gate electrode 9 located under the through-hole 23 is removed at the area where the through-hole 23 is located. The gate pad 17 is electrically connected to the gate electrode 9 located thereunder through the through-hole 23 and to the gate wiring 10. Since all the gate electrodes 9 are electrically connected to the gate wiring 10, adjustment of the potential of the gate pad 17 makes adjustment of the potentials of all the gate electrodes 9 possible.

Next, with reference to FIGS. 5 to 16, a description is given of an example of a method of manufacturing the semiconductor device according to the first embodiment.

Figure 5:
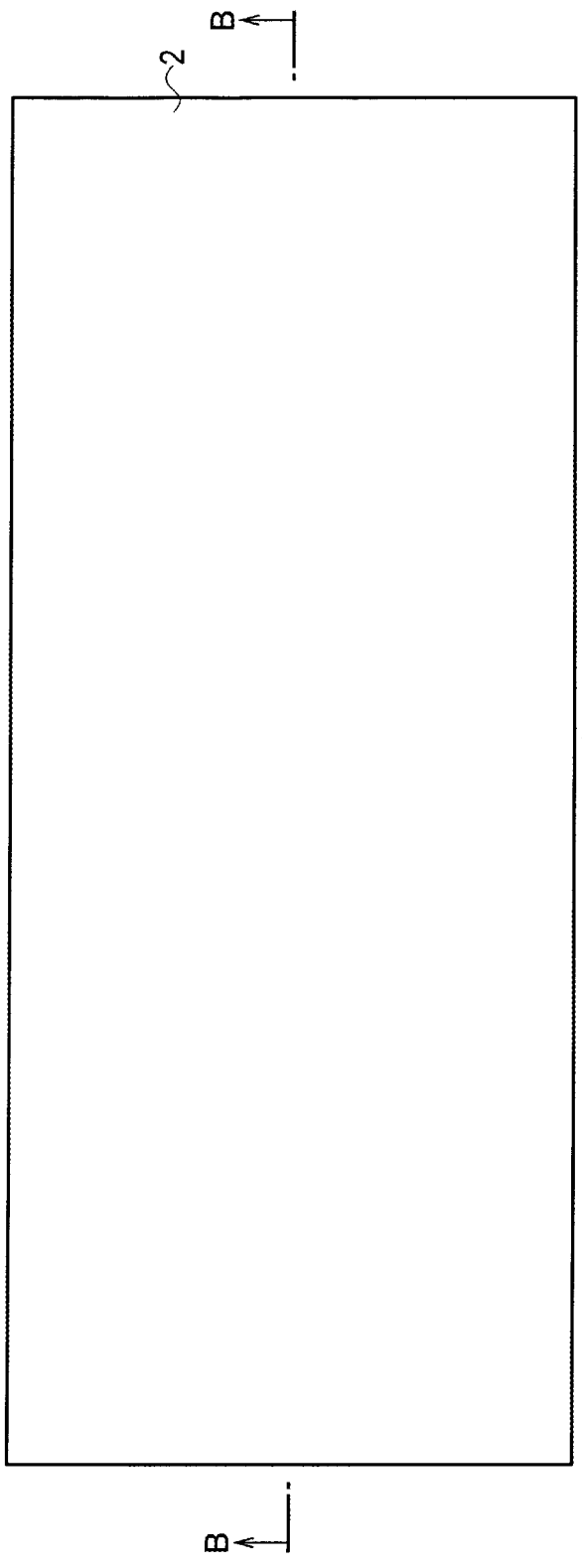
FIG. 5 is a plan view illustrating a method of manufacturing the semiconductor device according to the first embodiment of the present invention.
Figure 6:
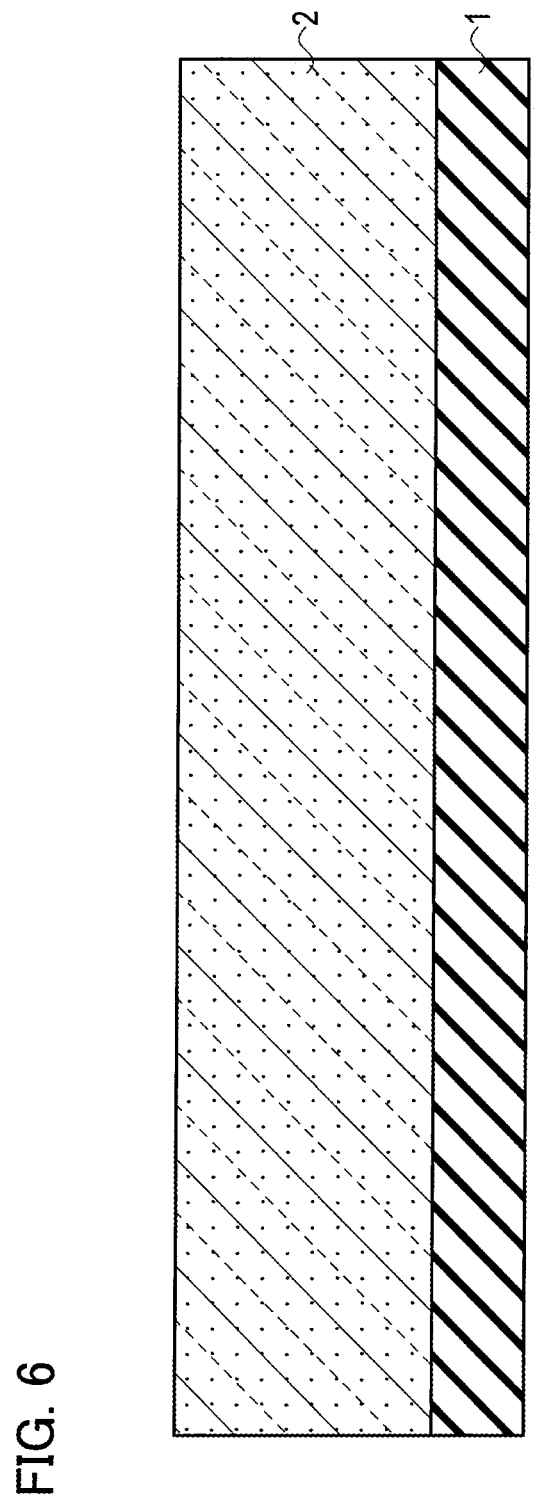
FIG. 6 is a sectional view seen in the direction B-B in FIG. 5.

First, as illustrated in FIGS. 5 and 6, the substrate 1 having the drift region 2 formed on the upper surface (first main surface) thereof is prepared. The substrate 1 is an insulating substrate made of undoped SiC. The drift region 2 is an n$^-$-type region formed on the substrate 1 by epitaxial growth.

Figure 7:
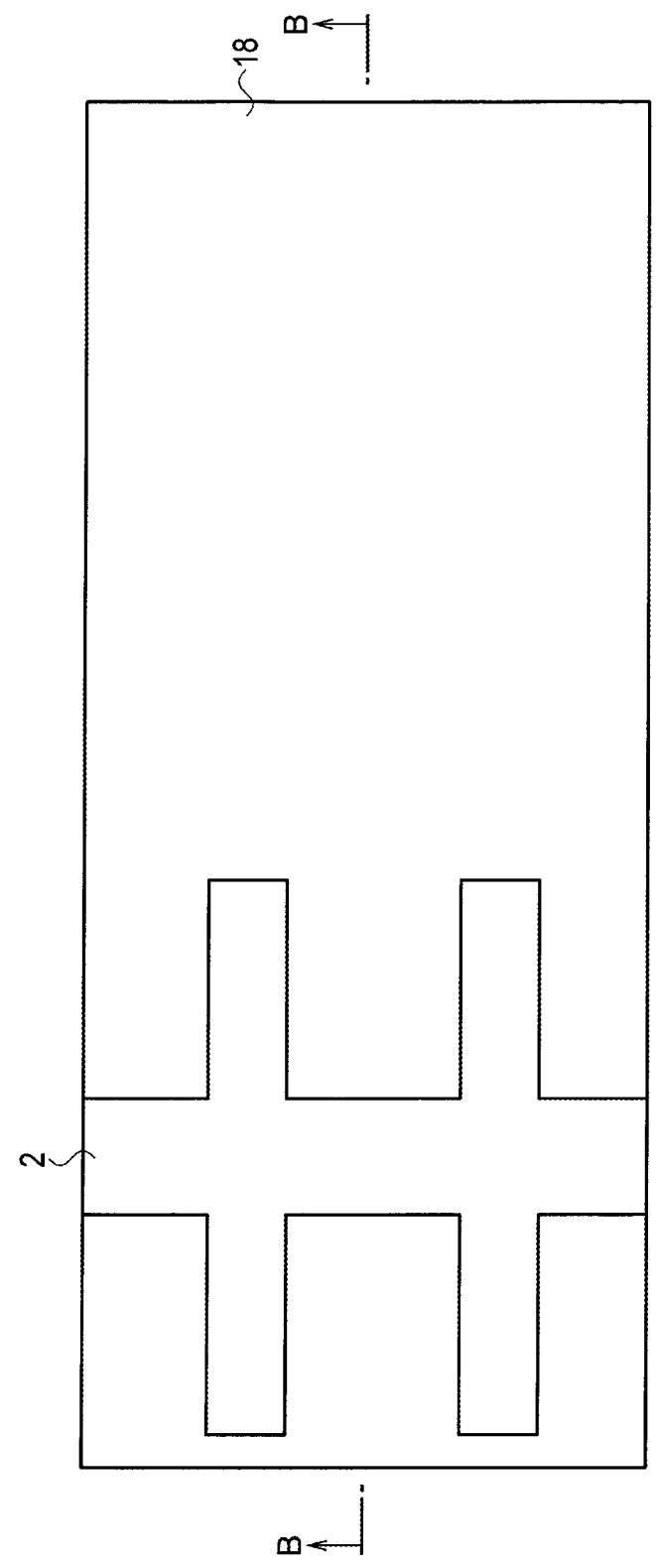
FIG. 7 is a plan view illustrating the method of manufacturing the semiconductor device according to the first embodiment of the present invention.
Figure 8:
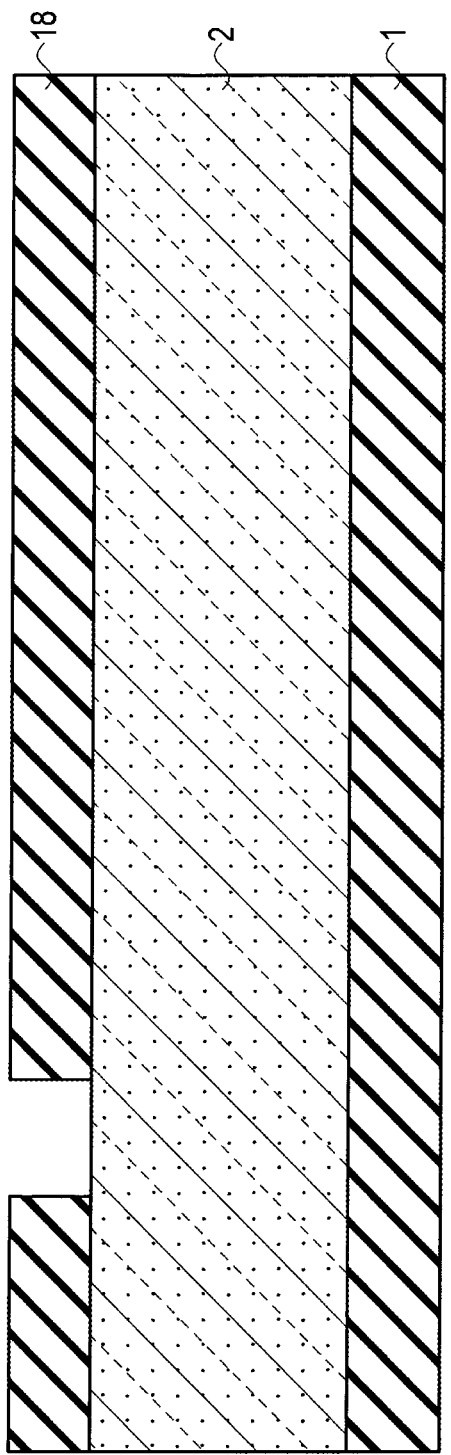
FIG. 8 is a sectional view seen in the direction B-B in FIG. 7.

Next, as illustrated in FIGS. 7 and 8, a mask material 18 is formed on the upper surface (the second main surface) of the drift region 2. The mask material 18 is formed by deposition of SiO$_2$ on the upper surface of the drift region 2 by chemical vapor deposition (CVD) to form a silicon oxide film and then patterning of the silicon oxide film. The patterning of the silicon oxide film is performed using photolithography and dry etching. Specifically, a resist is applied to the upper surface of the silicon oxide film, and is selectively removed only at areas where the source electrode groove 4 and the gate electrode grooves 7 are to be formed. The silicon oxide film is then patterned by dry etching, such as reactive ion etching (RIE), that uses the unremoved resist as a mask, and as a result, the mask material 18 for forming the source electrode groove 4 and the gate electrode groove 7 is formed. The unneeded resist is removed by use of oxygen plasma, sulfuric acid, or the like as necessary. Thereafter, the source electrode groove 4 and the gate electrode groove 7 are formed by dry etching using the mask material 18 as a mask.

Figure 9:
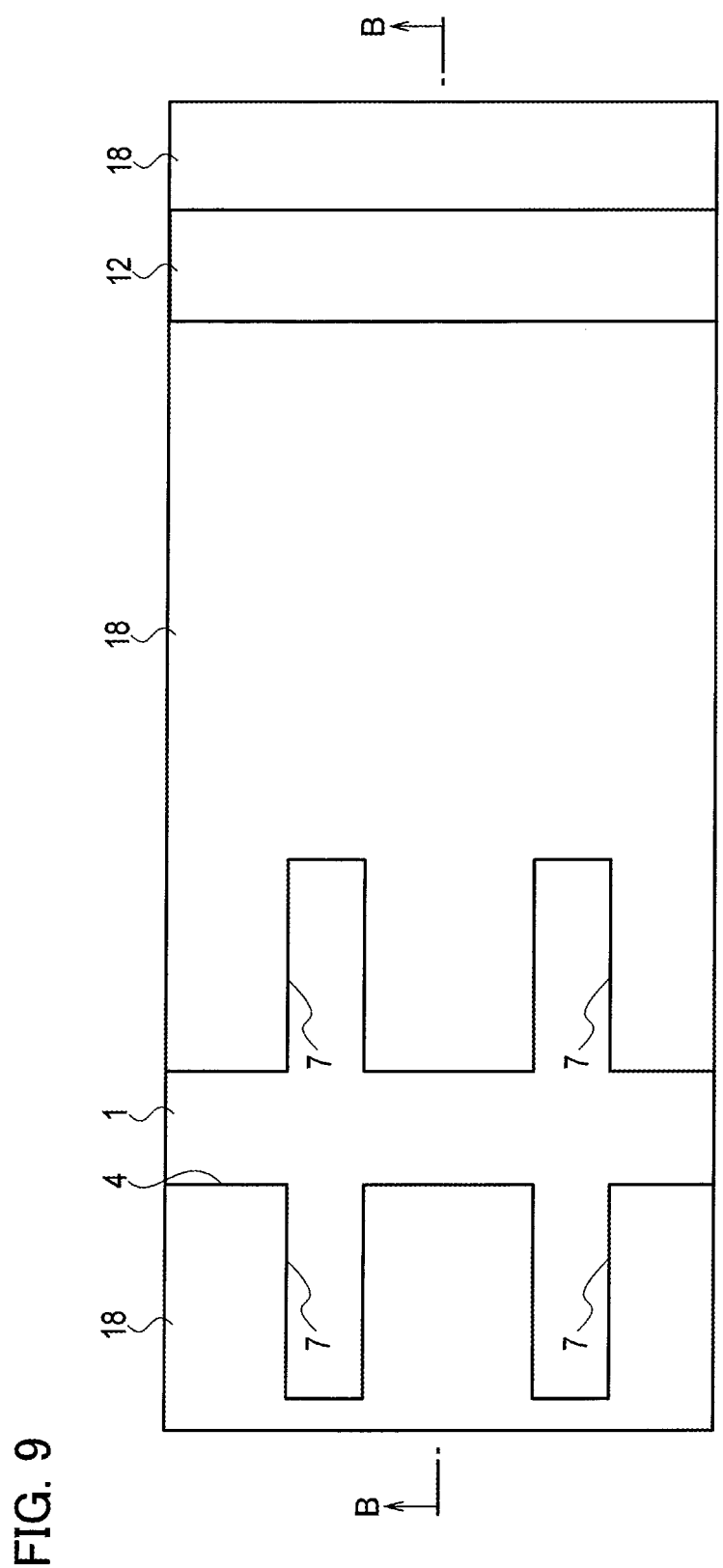
FIG. 9 is a plan view illustrating the method of manufacturing the semiconductor device according to the first embodiment of the present invention.
Figure 10:
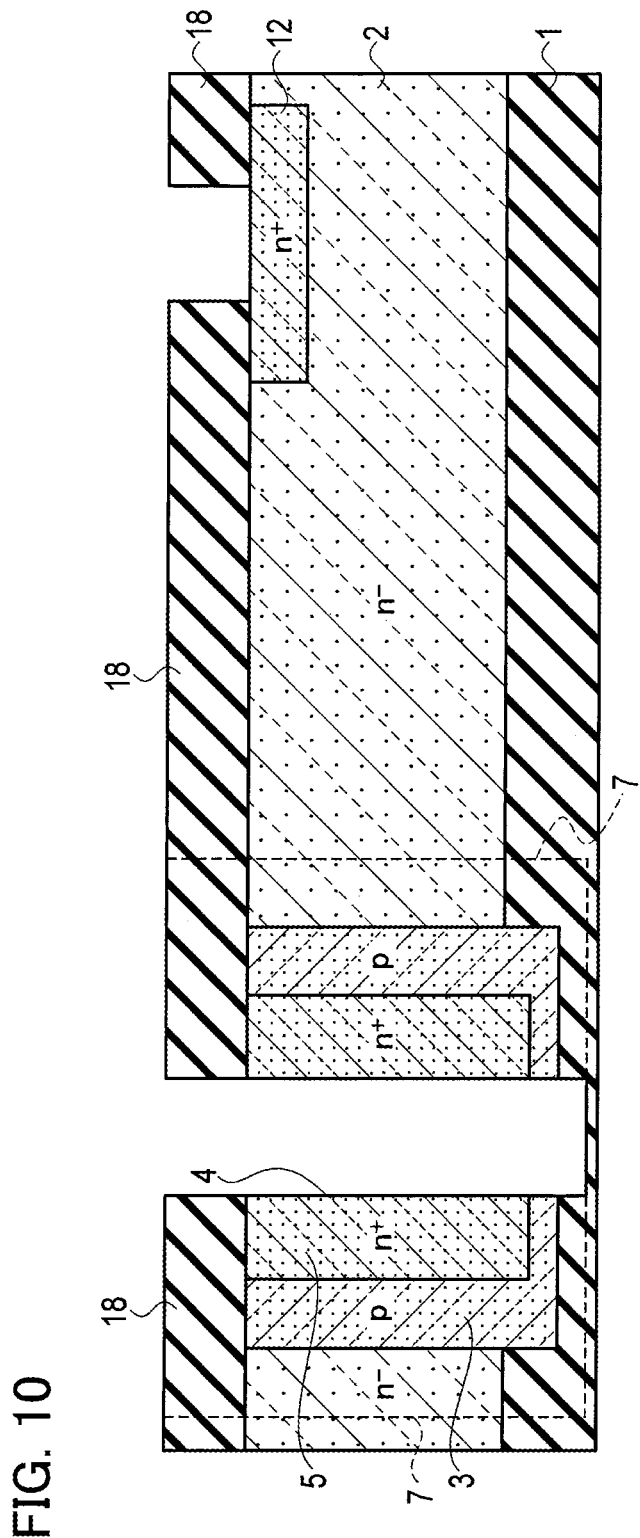
FIG. 10 is a sectional view seen in the direction B-B in FIG. 9.

Next, as illustrated in FIGS. 9 and 10, the p-type well region 3, the n$^+$-type source region 5, and the drain region 12 are formed. A resist is applied to the exposed surfaces of the substrate 1 and the drift region 2 by photolithography, and is removed at an area coinciding with the source electrode groove 4. Using the unremoved resist as a mask, p-type impurities such as boron (B) are implanted by ion implantation in a direction which is orthogonal to the direction in which the gate electrode grooves 7 extend (i.e., parallel to the x-y plane) and has a predetermined angle with respect to the second main surface of the drift region 2. The predetermined angle is, for example, 10° to 20°.

Then, a resist is applied to the mask material 18 by photography, and is selectively removed only at an area corresponding to an area where the drain region 12 is to be formed. Using the unremoved resist as a mask, the mask material 18 is patterned by dry etching. Using the patterned mask material 18 and the resist used for the boron implantation as a mask, n-type impurities are implanted by ion implantation in a predetermined direction. The n-type impurities are for example phosphorus (P), and the implantation direction is the same as that for the p-type impurities. However, the implantation energy for the n-type impurities is smaller than that for the p-type impurities so that the source region 5 may be formed inside the well region 3.

Thereafter, the mask material 18 is entirely removed by wet etching. Moreover, the ion-implanted impurities are activated by annealing. By the activation, the well region 3, the source region 5, and the drain region 12 are formed. Further, a thin silicon oxide film 20 is formed on the entire exposed surface by thermal oxidation. The silicon oxide film 20 has a thickness of, for example, approximately several tens of nm.

Figure 11:
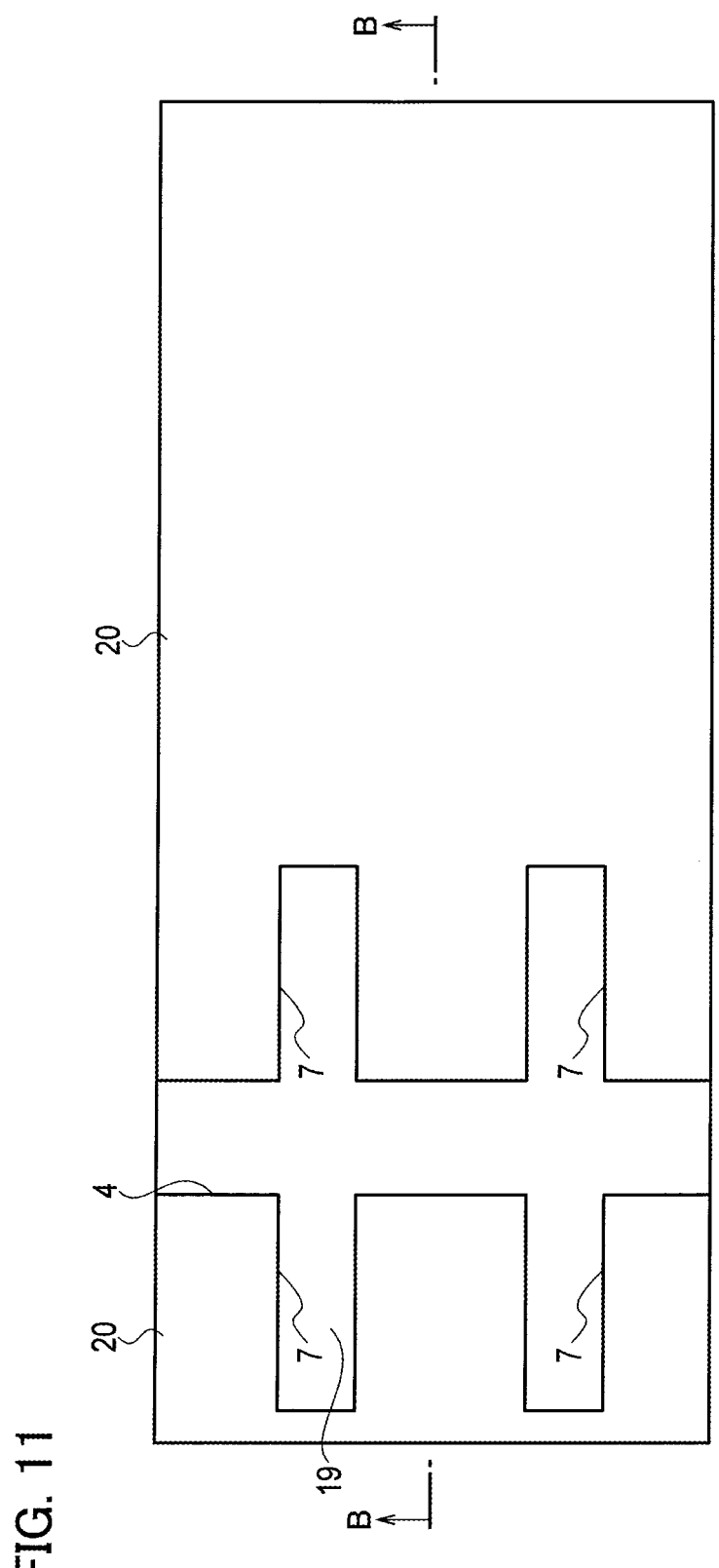
FIG. 11 is a plan view illustrating the method of manufacturing the semiconductor device according to the first embodiment of the present invention.
Figure 12:
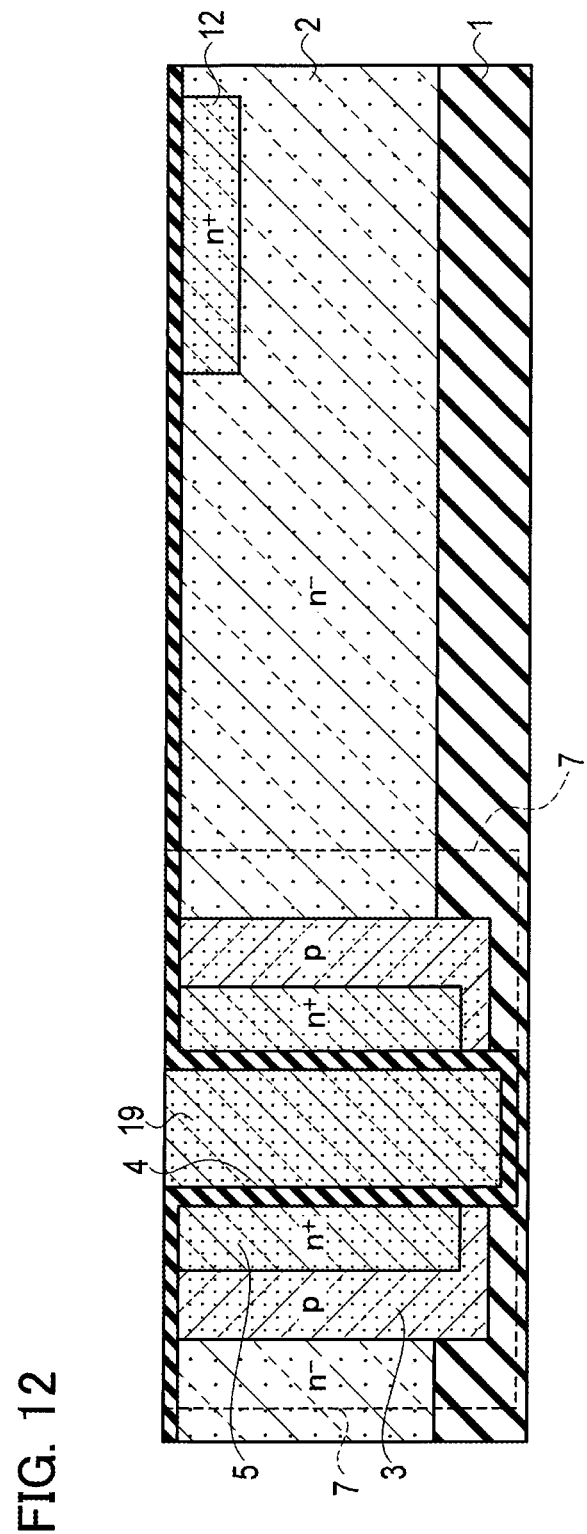
FIG. 12 is a sectional view seen in the direction B-B in FIG. 11.

Next, as illustrated in FIGS. 11 and 12, polycrystalline silicon 19 as a material for the gate electrode 9 and the gate wiring 10 is deposited by CVD in the source electrode groove 4 and the gate electrode grooves 7. When the polycrystalline silicon is deposited by CVD, a polycrystalline silicon film grows on an exposed surface irrespective of the orientation of the surface. For this reason, if the source electrode groove 4 and each gate electrode groove 7 are all 2 μm wide, the deposition thickness is set to 1 μm to fill the source electrode groove 4 and the gate electrode groove 7 with the polycrystalline silicon 19. Thereafter, the polycrystalline silicon 19 is etched 1 μm by dry etching to selectively remove the polycrystalline silicon 19 deposited on the second main surface of the drift region 2, leaving the polycrystalline silicon 19 deposited in the source electrode groove 4 and the gate electrode grooves 7.

Thereafter, a resist is applied to the upper surfaces of the silicon oxide film 20 and the polycrystalline silicon 19 by photolithography, and is selectively removed only at an area coinciding with the source electrode groove 4. Using the unremoved resist as a mask, the polycrystalline silicon 19 deposited inside the source electrode groove 4 is removed by dry etching, with several μm of the polycrystalline silicon 19 from the bottom surface being left unremoved. The polycrystalline silicon 19 left unremoved on the bottom surface of the source electrode groove 4 functions as the gate wiring 10. Then, the silicon oxide film 20 formed on the side surface of the source electrode groove 4 is removed by sacrificial oxidation.

Figure 13:
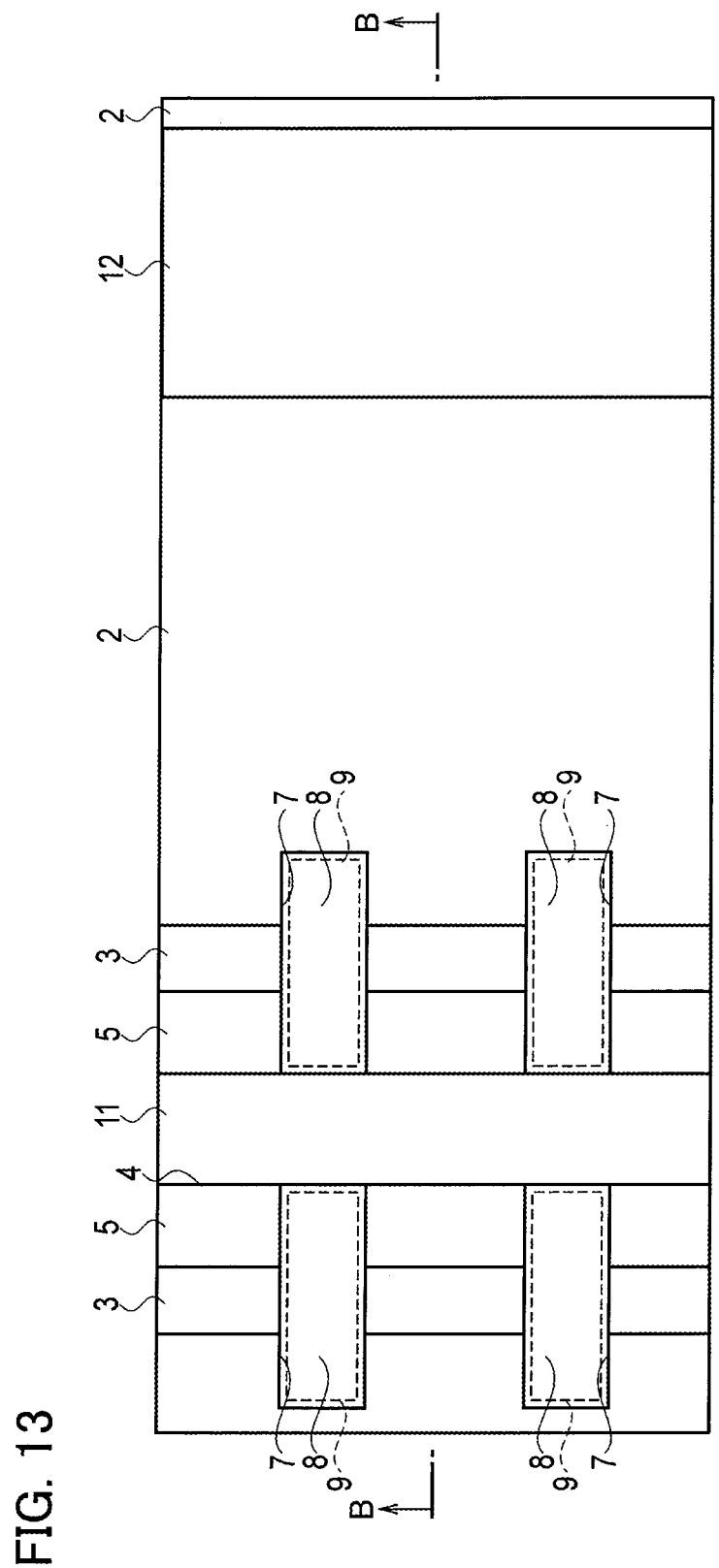
FIG. 13 is a plan view illustrating the method of manufacturing the semiconductor device according to the first embodiment of the present invention.
Figure 14:
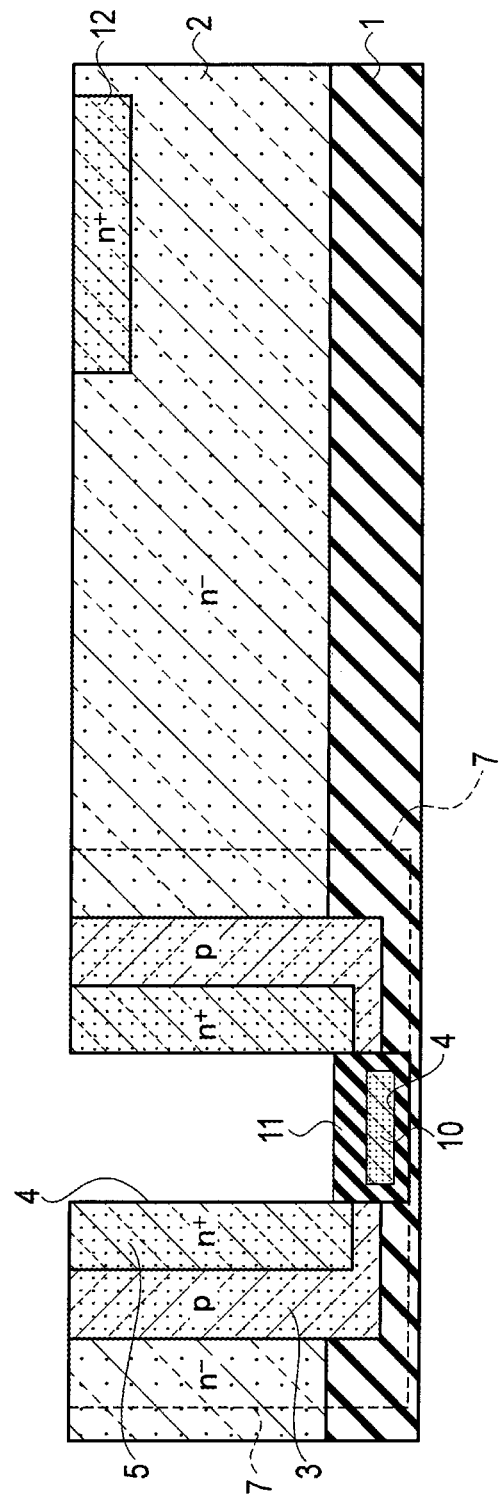
FIG. 14 is a sectional view seen in the direction B-B in FIG. 13.

Next, as illustrated in FIGS. 13 and 14, the silicon oxide film 11 is formed to cover the gate insulating film 8 covering the surface of the gate electrode 9 and the gate wiring 10. The silicon oxide film is formed on the entire exposed surface by thermal oxidation. Since polycrystalline silicon oxidizes faster than SiC, the silicon oxide film is formed thicker on the surface of the gate electrode 9 and the gate wiring 10 than on the other surface formed of SiC. The silicon oxidation film is selectively removed by wet etching using a process time such that only the silicon oxidation film formed on the surface formed of SiC is entirely removed, with the silicon oxidation film formed on the surface of the polycrystalline silicon 19 being left unremoved. As a result, the gate insulating film 8 is formed on the surface of the gate electrode 9, and the silicon oxide film 11 is formed on the surface of the gate wiring 10.

Figure 15:
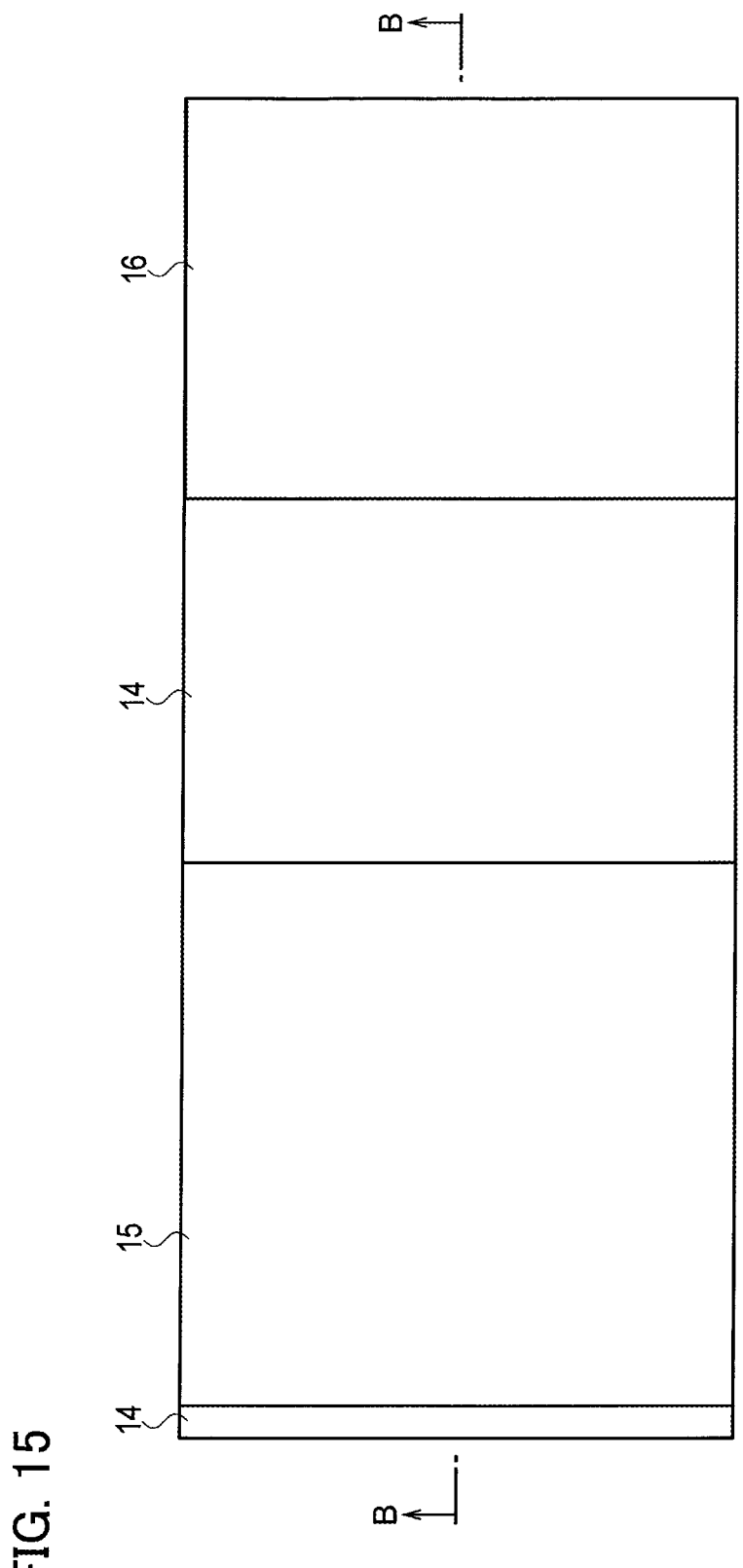
FIG. 15 is a plan view illustrating the method of manufacturing the semiconductor device according to the first embodiment of the present invention.
Figure 16:
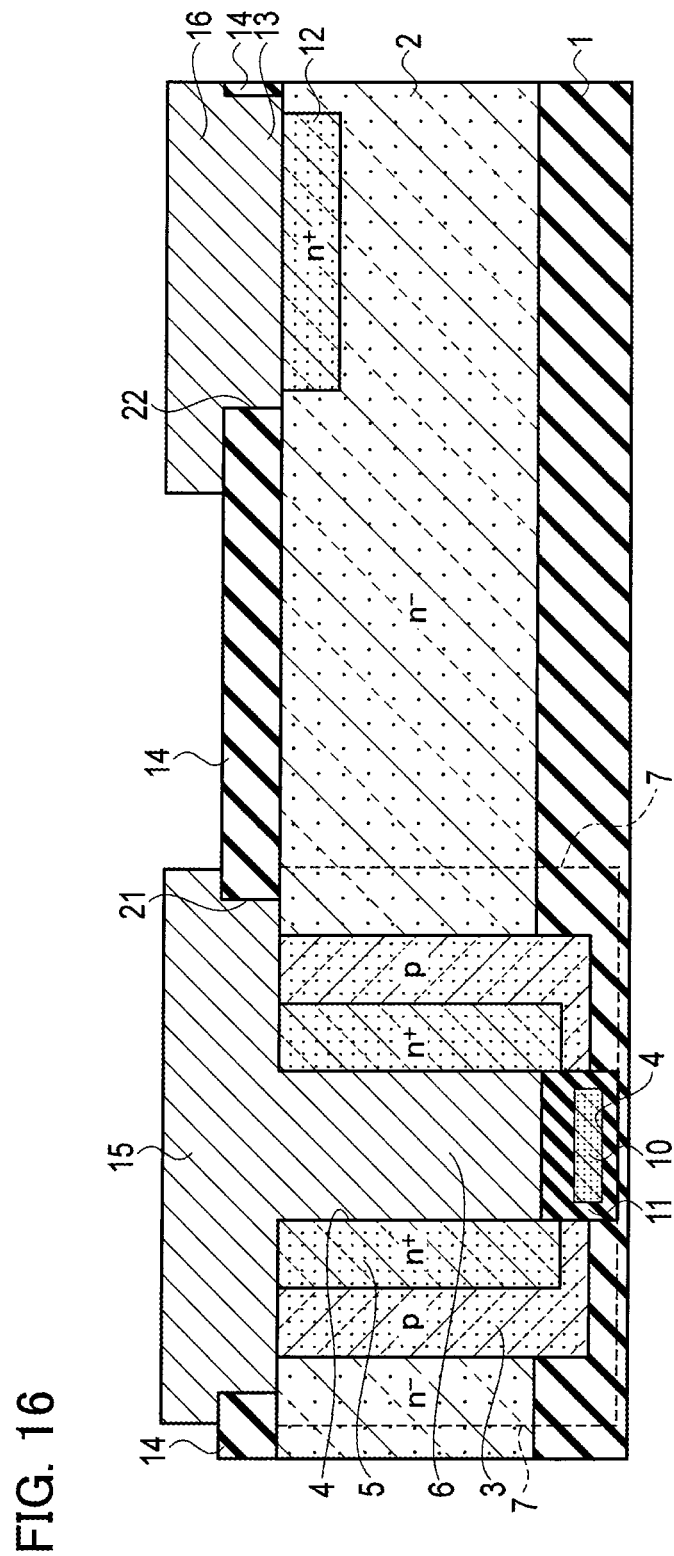
FIG. 16 is a sectional view seen in the direction B-B in FIG. 15.

Next, as illustrated in FIGS. 15 and 16, the source electrode 6, the source wiring 15, the drain electrode 13, and the drain wiring 16 are formed. A metal material as a material for the source electrode 6 and the drain electrode 13 is deposited by sputtering inside the source electrode groove 4 and on the second main surface of the drift region 2. A resist is applied to the surface of the metal material by photolithography, and is selectively removed except for areas, above the second main surface of the drift region 2, where the source electrode 6 and the drain electrode 13 are to be formed. Using the unremoved resist as a mask, the metal material located on the second main surface of the drift region 2 is selectively removed by sputter etching, and thereby the source electrode 6 and the drain electrode 13 are formed.

Thereafter, $SiO_2$ is deposited by CVD on the second main surface of the drift region 2 and the upper surface of the metal material left unremoved, and thereby the interlayer insulating film 14 is formed. A resist is applied to the upper surface of the interlayer insulating film 14 by photolithography, and is selectively removed at areas for the source electrode 6 and the drain electrode 13. Using the unremoved resist as a mask, the interlayer insulating film 14 is patterned by dry etching. Thereby, an upper end of the groove 21 to insert the source electrode 6 and an upper end of the groove 22 to insert the drain electrode 13 are opened.

Further, a metal material as a material for the source wiring 15 and the drain wiring 16 is deposited by sputtering. A resist is applied to the upper surface of the metal material by photolithography, and is selectively removed except for areas where the source wiring 15 and the drain wiring 16 are to be formed. Using the unremoved resist as a mask, the metal material is selectively removed by sputter etching. As a result, the source wiring 15 and the drain wiring 16 are formed. Through the above steps, the semiconductor device illustrated in FIG. 2 is completed.

Although part of the gate electrode 9 enters the source electrode groove 4 in the example illustrated in FIG. 1, the shape of the gate electrode 9 may be changed by adjustment of the mask pattern used in the etching of the polycrystalline silicon 19 deposited in the source electrode groove 4.

Next, the basic operation of the semiconductor device according to the first embodiment is described.

The semiconductor device according to the first embodiment functions as a transistor when the potential of the gate electrode 9 is controlled with a positive potential being applied to the drain electrode 13 while the potential of the source electrode 6 is used as a reference. Specifically, when the voltage between the gate electrode 9 and the source electrode 6 is set to a predetermined threshold or above, an inversion layer to serve as a channel is formed in the well region 3 located at the side surface of the gate electrode 9, bringing the semiconductor device into an ON state, so that currents flow from the drain electrode 13 to the source electrode 6. To be more specific, electrons flow from the source electrode 6 to the source region 5, and then from the source region 5 to the drift region 2 through the channel. The electrons further flow from the drift region 2 to the drain region 12, and then ultimately to the drain electrode 13.

When the voltage between the gate electrode 9 and the source electrode 6 is set below the predetermined threshold or below, the inversion layer in the well region 3 disappears, bringing the semiconductor device into an OFF state, so that currents between the drain electrode 13 and the source electrode 6 are shut off. In this event, voltage as high as several hundreds to several thousands of V may be applied between the drain and the source.

In general, gate wiring connected to a gate electrode is arranged near a well region. In this case, the potential of the gate wiring may influence the formation of the inversion layer and fluctuates the threshold. When the threshold fluctuates, an unintended operation such as false turn-on may occur, leading to decrease in the reliability of the device.

In the semiconductor device according to the first embodiment, the gate wiring 10 is formed inside the source electrode groove 4 and is therefore located at a position away from the well region 3. Hence, the channel formed in the well region 3 is less influenced by the gate wiring 10, and fluctuation of the threshold can be reduced.

Further, in the semiconductor device according to the first embodiment, the gate electrode 9 is in contact with the gate wiring 10 formed inside the source electrode groove 4, and hence, metal wiring and a contact hole are unnecessary at the upper surface side of the gate electrode 9. Thus, the width of the gate electrode 9 can be shortened, which leads to improvement in the degree of integration of the semiconductor device. Thereby, the number of the gate electrode 9 can be increased, which leads to an increase in the channel width and a decrease in on-resistance.

Further, in the semiconductor device according to the first embodiment, the gate wiring 10 is formed inside the source electrode groove 4, and therefore does not restrict the widths of the source wiring 15 and the drain wiring 16 formed on the upper surface of the interlayer insulating film 14. This can hence suppress deterioration of on-resistance and switching loss caused due to an increase in the resistance of the source wiring 15 and the drain wiring 16.

In the semiconductor device according to the first embodiment, the gate wiring 10 is in contact with the substrate 1 with the silicon oxide film 11 interposed therebetween and therefore can be formed from the drift region 2 into the substrate 1. Thus, the cross-sectional area of the gate wiring 10 can be increased to reduce the resistance of the gate wiring 10 and switching loss.

Further, in the semiconductor device according to the first embodiment, the source wiring 15 and the drain wiring 16 are each formed on the interlayer insulating film 14. Thus, compared to a case where these wiring layers are formed as a multi-layer structure, flatness can be improved. This can avoid deterioration of withstand voltage performance due to local electric field concentration at an insulating film between the wiring layers.

Further, in the semiconductor device according to the first embodiment, the substrate 1 is made of an insulator or a semi-insulator. Thus, when an end portion of at least one of the well region 3, the gate electrode 9, and the gate wiring 10 is located inside the substrate 1, electric field concentration at the end portion can be reduced. Consequently, withstand voltage performance can be improved.

Further, in the semiconductor device according to the first embodiment, the gate electrode 9 and the gate wiring 10 are made of the same material. Thus, the gate electrode 9 and the gate wiring 10 can be formed in the same step, and do not require a step of electrically connecting them to each other. Hence, the number of manufacturing man-hours can be reduced, and the manufacturing cost can be reduced. Further, this can also prevent resistance from occurring at the interface between the gate electrode 9 and the gate wiring 10.

Further, in the semiconductor device according to the first embodiment, the gate wiring 10 made of polycrystalline silicon is insulated from the source electrode 6 by the silicon oxide film 11 formed on the surface of the gate wiring 10. Thus, the silicon oxide film 11 to cover the gate wiring 10 can be formed readily by thermal oxidation. Further, since the drift region 2 is made of a material such as SiC which oxidizes more slowly than $SiO_2$, the silicon oxide film 11 can be formed selectively on the surface of the gate wiring 10 by isotropic etching. Thus, compared to a case where an oxide film is selectively formed on the gate wiring 10 using a mask formed of a non-oxidizing material such as silicon nitride, the number of manufacturing man-hours can be reduced, and therefore the manufacturing cost can be reduced.

Further, in the semiconductor device according to the first embodiment, the drift region 2 is made of a wide-bandgap semiconductor such as SiC. Thus, dielectric breakdown strength can be improved. For this reason, even if a steep electric field distribution occurs due to a short distance between the drain electrode 13 and the source electrode 6, withstand voltage performance can be ensured, and the degree of integration can be improved.

Further, in the semiconductor device according to the first embodiment, the gate wiring 10 is formed away from the drift region 2. Thus, an increase in the capacitance between the gate and the drain can be suppressed. If the gate wiring were formed near the drift region, the capacitance between the gate and the drain would increase because the potential of the drift region is almost equal to that of the drain electrode. In this regard, the semiconductor device according to the first embodiment suppresses an increase in the capacitance between the gate and the drain and therefore can reduce switching loss.

Further, in the semiconductor device according to the first embodiment, the substrate 1 and the drift region 2 are formed of the same material. Thus, the possibility of warpage occurring due to stress can be reduced to improve the reliability of the element.

Second Embodiment

Figure 17:
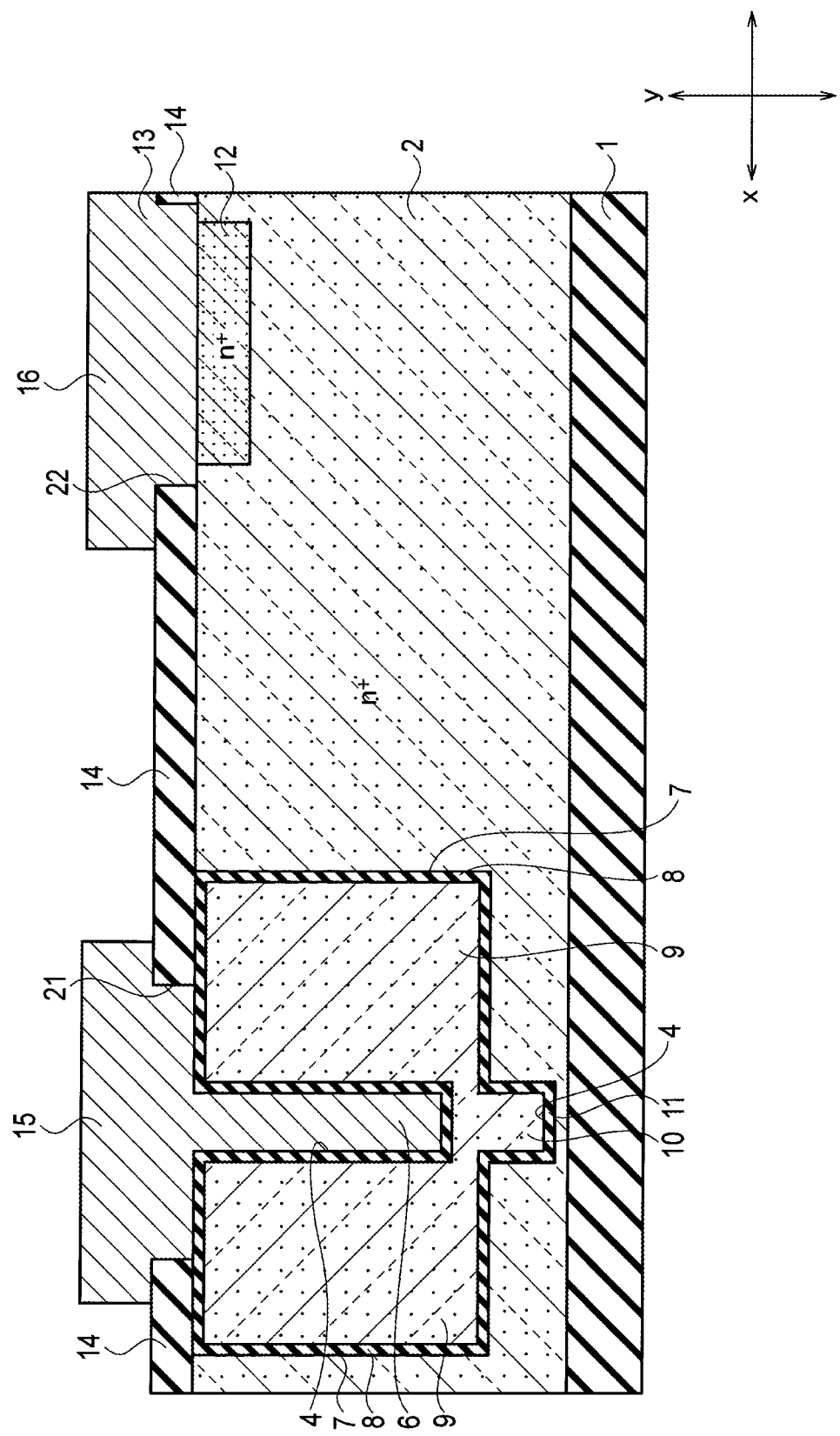
FIG. 17 is a sectional view illustrating a semiconductor device according to a second embodiment of the present invention.

FIG. 17 is a sectional view illustrating a semiconductor device according to a second embodiment of the present invention. Note that FIG. 17 is a sectional view of the semiconductor device according to the second embodiment taken along the x-y plane passing through the gate electrode 9. The semiconductor device according to the second embodiment is different from that of the first embodiment in that, for example, the source electrode groove 4 is formed more deeply than the gate electrode groove 7. Configurations, operations, and advantageous effects of the second embodiment that are substantially the same as those of the first embodiment are not described to avoid repetition.

In the second embodiment, the depth of the source electrode groove 4 is smaller than the thickness of the drift region 2, and thus, the source electrode groove 4 is not in contact with the substrate 1. Moreover, the gate electrode groove 7 is shallower than the source electrode groove 4.

The mask used for forming the source electrode groove 4 and the gate electrode groove 7 is thinned and decreased in strength by dry etching. In the semiconductor device according to the second embodiment, the depths of the source electrode groove 4 and the gate electrode groove 7 are smaller than the thickness of the drift region 2. For this reason, the silicon oxide film to serve as a mask for forming the source electrode groove 4 and the gate electrode groove 7 in the manufacturing steps can be made thinner than the mask material 18 in the first embodiment. Note that the source electrode groove 4 can be formed more deeply than the gate electrode groove 7 when dry etching for making the grooves is designed so that the width of the source electrode groove 4 may be larger than the width of the gate electrode groove 7.

In the semiconductor device according to the second embodiment, the source electrode groove 4 is formed more deeply than the gate electrode groove 7. Thus, the gate wiring 10 can be formed more deeply and increased in its cross-sectional area of the gate wiring 10. Hence, the resistance of the gate wiring 10 can be reduced, and switching loss can be reduced.

Further, in the semiconductor device according to the second embodiment, the depth of the gate electrode groove 7 is smaller than the thickness of the drift region 2. Thus, the channel is formed also at the side of the well region 3 close to the bottom surface of the gate electrode groove 7. Hence, the channel width can be increased, and on-resistance can be decreased.

(Modification)

Figure 18:
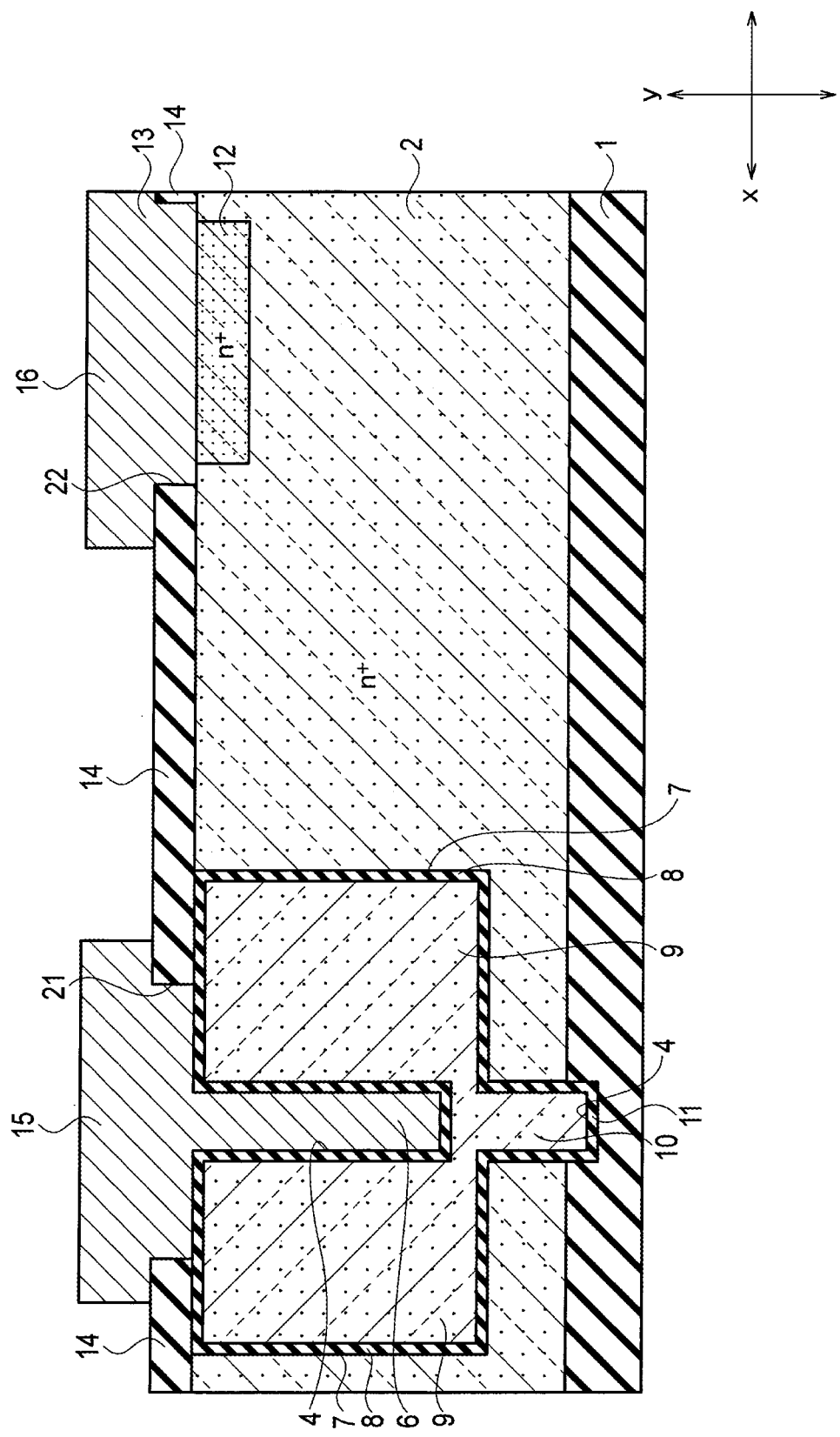
FIG. 18 is a sectional view illustrating a semiconductor device according to a modification of the second embodiment of the present invention.

FIG. 18 is a sectional view illustrating a semiconductor device according to a modification of the second embodiment of the present invention. The semiconductor device according to the modification of the second embodiment is different from that of the second embodiment in that the bottom portion of the source electrode groove 4 is located inside the substrate 1. Configurations, operations, and advantageous effects of the modification of the second embodiment that are substantially the same as those of the second embodiment are not described to avoid repetition.

In the modification of the second embodiment, the source electrode groove 4 is formed more deeply than the gate electrode groove 7 and is in contact with the substrate 1. At the bottom part of the source electrode groove 4, the gate wiring 10 is in contact with the substrate 1 with the silicon oxide film 11 interposed therebetween. Thus, an end portion of the gate wiring 10 is located inside the substrate 1. Herein, the end portion means a portion where a surface perpendicular to the second main surface of the drift region 2 intersects an end surface opposite from the second main surface of the drift region 2. Note that when the silicon oxide film to serve as a mask for forming the source electrode groove 4 and the gate electrode groove 7 is thicker than the mask material 18 in the first embodiment in the manufacturing steps, the grooves can be deepened. Further, by adjustment of the ratio between the width of the source electrode groove 4 and the width of the gate electrode groove 7, the ratio between the depth of the source electrode groove 4 and the depth of the gate electrode groove 7 can be adjusted.

In the semiconductor device according to the modification of the second embodiment, the source electrode groove 4 is formed more deeply than the thickness of the drift region 2. Thus, the gate wiring 10 can be formed even more deeply and increased in its cross-sectional area. Hence, the resistance of the gate wiring 10 can be reduced, and switching loss can be reduced.

Further, in the semiconductor device according to the modification of the second embodiment, the bottom portion of the source electrode groove 4 is in contact with the substrate 1. Thus, electric field concentration at the end portion of the source electrode groove 4 can be reduced to improve withstand voltage performance.

Third Embodiment

Figure 19:
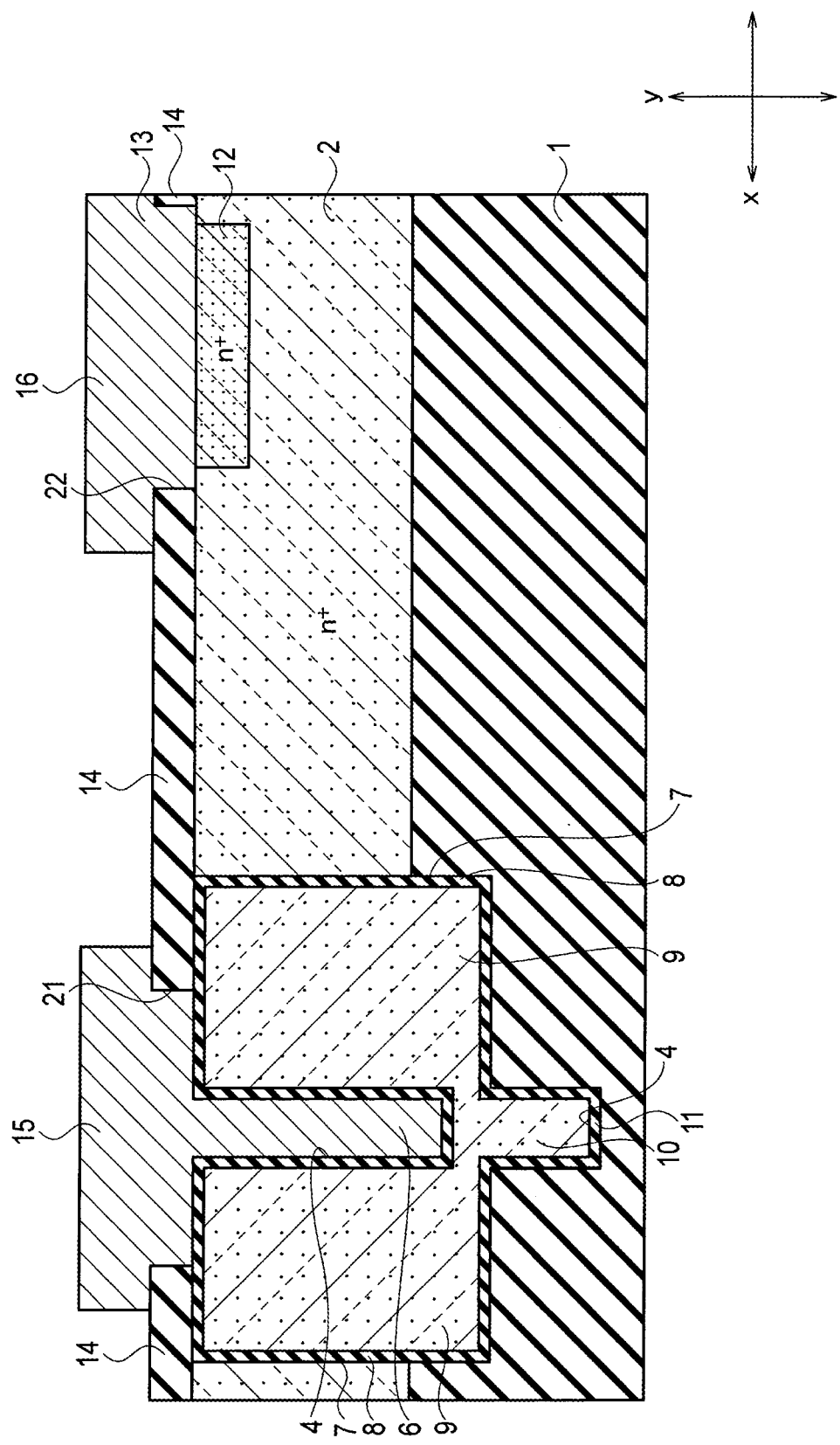
FIG. 19 is a sectional view illustrating a semiconductor device according to a third embodiment of the present invention.

FIG. 19 is a sectional view illustrating a semiconductor device according to a third embodiment of the present invention. The semiconductor device according to the third embodiment is different from that of the second embodiment in that the bottom portion of the gate electrode groove 7 is in contact with the substrate 1. Configurations, operations, and advantageous effects of the third embodiment that are substantially the same as those of the first and second embodiments are not described to avoid repetition.

In the third embodiment, the source electrode groove 4 is deeper than the gate electrode groove 7, and the source electrode groove 4 and the gate electrode groove 7 are formed in contact with the substrate 1. At the bottom portion of the source electrode groove 4, the gate wiring 10 is in contact with the substrate 1 with the silicon oxide film 11 interposed therebetween. The gate electrode 9 is still in contact with the substrate 1 with the gate insulating film 8 interposed therebetween. When the silicon oxide film to serve as a mask for forming the source electrode groove 4 and the gate electrode groove 7 is thicker than the mask in the second embodiment in the manufacturing steps, the grooves can be deepened. Further, by adjustment of the ratio between the width of the source electrode groove 4 and the width of the gate electrode groove 7, the ratio between the depth of the source electrode groove 4 and the depth of the gate electrode groove 7 can be adjusted.

In the semiconductor device according to the third embodiment, the end portion of the gate electrode groove 7 is in contact with the substrate 1. Thus, electric field concentration at the end portion of the gate electrode groove 7 can be reduced to be able to decrease dielectric breakdown of the gate insulating film 8 and improve withstand voltage performance.

Fourth Embodiment

Figure 20:
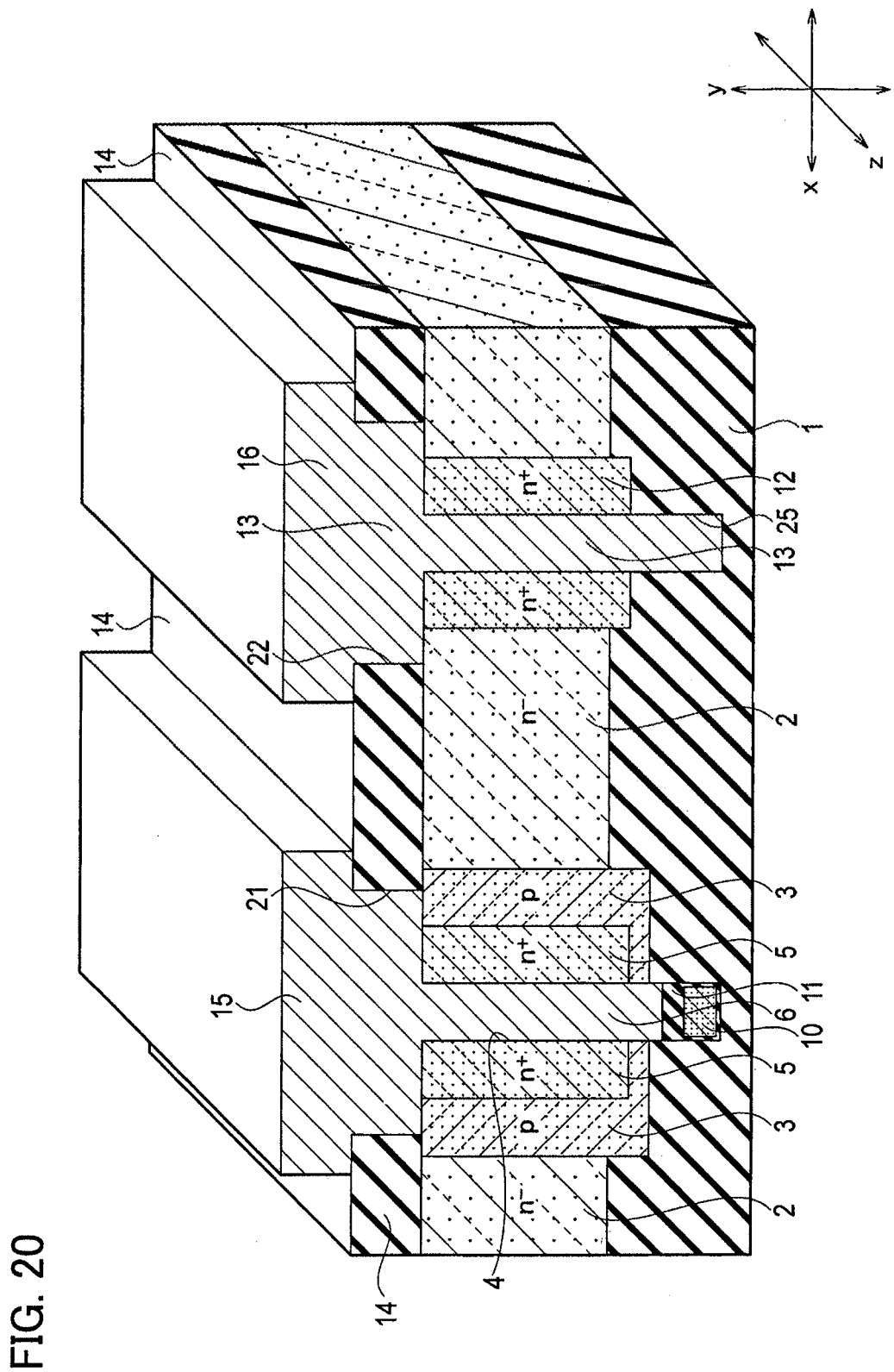
FIG. 20 is a sectional view illustrating a semiconductor device according to a fourth embodiment of the present invention.

FIG. 20 is a sectional view illustrating a semiconductor device according to a fourth embodiment of the present invention. The semiconductor device according to the fourth embodiment is different from those of the first to third embodiments in, for example, including a drain electrode groove 25 in which the drain electrode 13 is formed. Configurations, operations, and advantageous effects of the fourth embodiment that are substantially the same as those of the first to third embodiments are not described to avoid repetition.

The drain electrode groove 25 is formed inside the drift region 2 at a position away from the well region 3. The drain electrode groove 25 is formed from the second main surface of the drift region 2 into the substrate 1 in a direction perpendicular to the second main surface of the drift region 2 (y-axis direction). The drain region 12 is in contact with the side surface of the drain electrode groove 25. In the fourth embodiment, the drain region 12 is formed from the second main surface of the drift region 2 into the substrate 1 with respect to the second main surface of the drift region 2 (y-axis direction). The drain electrode groove 25 is deeper than the drain region 12.

The drain electrode groove 25 can be formed when, in the method of manufacturing the semiconductor device according to the first embodiment, the silicon oxide film to serve as the mask material 18 is selectively removed also at an area where the drain electrode groove 25 is to be formed. By dry etching using this mask material 18 as a mask, the source electrode groove 4, the gate electrode groove 7, and the drain electrode groove 25 can be formed simultaneously.

Further, by the formation of the drain electrode groove 25, the step of forming the drain region 12 can form the drain region 12 at a deep position without having to implant the impurities with the implantation energy as high as that in the first embodiment.

In the semiconductor device according to the fourth embodiment, the drain electrode groove 25 is formed more deeply than the drift region 2. Thus, an electric field distribution in the depth direction of the drift region 2 (y-axis direction) can be reduced. Hence, electric field concentration is reduced, and withstand voltage performance can be improved.

Further, in the semiconductor device according to the fourth embodiment, the drain region 12 having a higher impurity concentration than the drift region 2 is formed more deeply than the drift region 2. Thus, the current path can be changed from the drift region 2 to the drain region 12. Hence, on-resistance can be reduced.

Other Embodiments

Although the embodiments of the present invention are described above, it should not be understood that the description and drawings which constitute part of this disclosure limit the present invention. From this disclosure, various alternative embodiments, examples, and operation techniques will be easily found by those skilled in the art.

For example, although a semiconductor device is manufactured on the substrate 1 and the drift region 2 that are made of SiC in the first to fourth embodiments, their material is not limited to SiC. For example, examples of a wide-gap semiconductor usable as the material for the substrate 1 and the drift region 2 include gallium nitride (GaN), diamond, zinc oxide (ZnO), and aluminum gallium nitride (AlGaN).

Further, although the drift region 2 is formed by epitaxial growth in the first to fourth embodiments, the drift region 2 may be formed by implantation of n-type impurities into a substrate made of an insulator such as SiC.

Further, in the first to fourth embodiments, the substrate 1 may be made of an n-type semiconductor having a lower impurity concentration than the drift region 2. Thereby, when the semiconductor device is in an ON state, currents flow inside the substrate 1. This leads to a broader current path and therefore more currents. If the substrate 1 were a p-type semiconductor, a depletion layer would broaden inside the drift region 2 to narrow the current path, thus leading to less currents. In other words, when the substrate 1 and the drift region 2 are of the same conductivity type, currents increase and loss decreases.

Further, in the first to fourth embodiments, the bottom surfaces of the gate electrode groove 7 and the source electrode groove 4 may be higher or lower than the first main surface of the drift region 2, or may coincide with the first main surface. Further, the position of the gate wiring 10 inside the source electrode groove 4 may be higher than the bottom surface of the gate electrode groove 7.

In the first to fourth embodiments, a MOSFET is described as an example of a semiconductor device, but it goes without saying that the semiconductor devices according to the embodiments of the present invention are also applicable to insulated-gate bipolar transistors (IGBT) or thyristors.

Further, expressions such as "parallel", "perpendicular" and "orthogonal" in the first to fourth embodiments are not based on complete topology, and allow incomplete topology for the reasons of photolithography or other processes.

Additionally, the present invention naturally includes various embodiments which are not described herein, such as configurations in which the above configurations are applied to one another. Accordingly, the technical scope of the present invention should be determined only by the matters to define the invention in the scope of claims regarded as appropriate based on the description.

REFERENCE SIGNS LIST 1 substrate
2 drift region
3 well region
4 source electrode groove
5 source region
6 source electrode
7 gate electrode groove
8 gate insulating film
9 gate electrode
10 gate wiring
11 silicon oxide film
12 drain region
13 drain electrode
14 interlayer insulating film
15 source wiring
16 drain wiring

The invention claimed is:

1. A semiconductor device comprising:
a substrate;
a drift region of a first conductivity type provided on a first main surface of the substrate and having a higher impurity concentration than the substrate;
a source electrode groove formed from a second main surface of the drift region in a direction perpendicular to the second mains surface, the second main surface being opposite from the first main surface;
a well region of a second conductivity type in contact with a side surface of the source electrode groove and formed inside the drift region at least partially;
a source region of the first conductivity type in contact with a side surface of the source electrode groove and formed inside the well region;
a source electrode electrically connected to the source region;
a gate electrode groove Ruined from the second main surface in the perpendicular direction so as to be in contact with the drift region, the well region, and the source region;
a gate insulating film formed on a surface of the gate electrode groove;
a gate electrode formed on a surface of the gate insulating film;
a drain region of the first conductivity type formed inside the drift region away from the well region; and
a drain electrode electrically connected to the drain region, wherein
the gate electrode groove is formed in contact with the source electrode groove, and
the semiconductor device further comprises a gate wiring electrically insulated from the source electrode and formed inside the source electrode groove in contact with the gate electrode.

2. The semiconductor device according to claim 1, wherein the source electrode groove is formed more deeply than the gate electrode groove.

3. The semiconductor device according to claim 1, wherein the gate wiring is formed in contact with the substrate via an insulating film.

4. The semiconductor device according to claim 1, further comprising:
an interlayer insulating film formed on the second main surface;

a source wiring electrically connected to the source electrode; and a drain wiring electrically connected to the drain electrode, wherein the source wiring and the drain wiring are formed on a main surface of the interlayer insulating film opposite from and parallel to the second main surface.

5. The semiconductor device according to claim 1, wherein the substrate is made of an insulator or a semi-insulator.

6. The semiconductor device according to claim 1, wherein the gate electrode and the gate wiring are formed of the same material.

7. The semiconductor device according to claim 1, wherein the gate wiring is formed of silicon and electrically insulated from the source electrode by a silicon oxide film formed on a surface of the gate wiring.

8. The semiconductor device according to claim 1, wherein the drift region is made of a wide-bandgap semiconductor.

\* \* \* \* \*